United States Patent
Coon et al.

(10) Patent No.: US 12,130,217 B2
(45) Date of Patent: *Oct. 29, 2024

(54) GAS PHASE SAMPLE PREPARATION FOR CRYO-ELECTRON MICROSCOPY

(71) Applicant: Wisconsin Alumni Research Foundation, Madison, WI (US)

(72) Inventors: Joshua Coon, Middleton, WI (US); Michael Westphall, Fitchburg, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/984,934

(22) Filed: Nov. 10, 2022

(65) Prior Publication Data

US 2023/0266214 A1 Aug. 24, 2023

Related U.S. Application Data

(63) Continuation of application No. 17/365,698, filed on Jul. 1, 2021, now Pat. No. 11,525,760, which is a
(Continued)

(51) Int. Cl.
*G01N 1/42* (2006.01)
*G01N 1/36* (2006.01)
(Continued)

(52) U.S. Cl.
CPC .............. *G01N 1/42* (2013.01); *G01N 1/36* (2013.01); *G01N 15/1468* (2013.01);
(Continued)

(58) Field of Classification Search
CPC ........ G01N 1/42; G01N 1/36; G01N 15/1468; H01J 49/164; H01J 49/165; H01J 37/28; H01J 37/26
(Continued)

(56) References Cited

U.S. PATENT DOCUMENTS 11,092,523 B2 * 8/2021 Coon .................... H01J 49/164
11,525,760 B2 * 12/2022 Coon ........................ G01N 1/36
(Continued)

FOREIGN PATENT DOCUMENTS

CN 1590086 A 3/2005
CN 102404927 A 4/2012
(Continued)

OTHER PUBLICATIONS

Blake et al. (2004) "Preparative Linear Ion Trap Mass Spectrometer for Separation and Collection of Purified Proteins and Peptides in Arrays Using Ion Soft Landing," Analytical Chemistry 76(21):6293-6305.
(Continued)

*Primary Examiner* — Nicole M Ippolito
(74) *Attorney, Agent, or Firm* — Leydig, Voit & Mayer, Ltd.

(57) ABSTRACT

The present invention provides methods for controllably forming a layer of amorphous ice and other amorphous solids on a substrate, and also provides cryo-electron microscopy (cryo-EM) sample preparation methods and systems that utilize in vacuo formation of amorphous ice and other solids. Formation of the amorphous solid layer can be independent of the deposition of sample molecules to be analyzed using electron microscopy, and allows for the generation of a uniformly thick layer. Optionally, mass spectrometry instruments are used to generate and purify molecules deposited on the generated amorphous solid layer. The techniques and systems described herein can deliver near ideal cryo-EM sample preparation to greatly increase resolution, sensitivity, scope, and throughput of cryo-EM protein imaging, and therefore greatly impact the field of structural biology.

20 Claims, 16 Drawing Sheets

Related U.S. Application Data continuation of application No. 16/626,250, filed as application No. PCT/US2018/041120 on Jul. 6, 2018, now Pat. No. 11,092,523.

(60) Provisional application No. 62/529,778, filed on Jul. 7, 2017.

(51) Int. Cl.
    *G01N 15/14* (2006.01)
    *H01J 37/26* (2006.01)
    *H01J 37/28* (2006.01)
    *H01J 49/16* (2006.01)

(52) U.S. Cl.
    CPC .............. *H01J 37/26* (2013.01); *H01J 37/28* (2013.01); *H01J 49/164* (2013.01); *H01J 49/165* (2013.01); *H01J 2237/31745* (2013.01)

(58) Field of Classification Search
    USPC ...... 250/440.11, 441.11, 442.11, 443.1, 306, 250/307, 309, 310, 311
    See application file for complete search history.

(56) References Cited

U.S. PATENT DOCUMENTS

| | | |
|---|---|---|
| 2006/0262317 A1 | 11/2006 | Doak et al. |
| 2011/0027876 A1 | 2/2011 | Lihl et al. |
| 2012/0003394 A1 | 1/2012 | Mulders et al. |
| 2012/0241607 A1 | 9/2012 | Bose et al. |
| 2013/0205808 A1 | 8/2013 | Mulders et al. |
| 2013/0288182 A1 | 10/2013 | Branton et al. |
| 2014/0166880 A1 | 6/2014 | Shiue et al. |
| 2014/0360286 A1 | 12/2014 | Carragher et al. |
| 2016/0189919 A1 | 6/2016 | Passmore et al. |
| 2016/0245732 A1 | 8/2016 | Rémigy |
| 2016/0351374 A1 | 12/2016 | Wang |
| 2020/0158607 A1 | 5/2020 | Coon et al. |
| 2022/0065761 A1 | 3/2022 | Coon et al. |

FOREIGN PATENT DOCUMENTS

| | | |
|---|---|---|
| CN | 105531792 A | 4/2016 |
| GB | 913433 | 9/2009 |
| JP | 2008-538235 A | 10/2008 |
| JP | 2013-164419 A | 8/2013 |
| JP | 2014-522478 A | 9/2014 |
| TW | 201231948 A | 8/2012 |
| WO | WO 2011/012844 A1 | 2/2011 |

OTHER PUBLICATIONS

Bonislawski (May 2017) "Thermo Fisher Targets Structural Biology Space With Mass Spec, Cryo-EM Offerings," GenomeWeb, 3 pp.

Cheng et al. (2015) "A Primer to Single-Particle Cryo-Electron Microscopy," Cell 161(3):438-449.

Cleeves et al. (2014) "The ancient heritage of water ice in the solar system," Science 345(6204): 1590-1593.

Dohnalek et al. (2003) "The deposition angle-dependent density of amorphous solid water films," Journal of Chemical Physics 118(1): 364-372.

Extended European Search Report, dated Feb. 11, 2021, corresponding to European Patent Application No. 18828718.9, 8 pages.

Fama et al. (2008) "Sputtering of ice by low-energy ions," Surface Science 602(1):156-161.

Glaeser (Jan. 2016) "How good can cryo-EM become?," Nature Methods 13(1):28-32.

Guillot et al. (2004) "Investigation of vapor-deposited amorphous ice and irradiated ice by molecular dynamics simulation," J. Chemical Physics 120(9):4366-4382.

Gutzler et al. (2010) "Combination of a Knudsen effusion cell with a quartz crystal microbalance: In situ measurement of molecular evaporation rates with a fully functional deposition source," Review of Scientific Instruments 81(1): 015108-1-015108-4.

Huffstetler et al. (2001) "Resistively heated molecular beam doser for water deposition in ultrahigh vacuum," Journal of Vacuum Science & Technology a—Vacuum Surfaces and Films 19(3):1030-1031.

International Preliminary Report on Patentability, dated Jan. 16, 2020, corresponding to International Application No. PCT/US2018/041120 (filed Jul. 6, 2018), 7 pp.

Mastrapa et al. (2008) "Optical constants of amorphous and crystalline H2O-ice in the near infrared from 1.1 to 2.6 um," Icarus 197(1):307-320.

Mishima et al. (1998) "The relationship between liquid, supercooled and glassy water," Nature 396(6709): 329-335.

Moeller et al. (2012) "Measurement of the accumulation of water ice on optical components in cryogenic vacuum environments," Optical Engineering 51(11): 115601-1-115601-8.

Search Report and Written Opinion, dated Oct. 1, 2018, corresponding to International Application No. PCT/US2018/041120 (filed Jul. 6, 2018), 9 pp.

Seo et al. (Nov. 2016) "Retention of Native Protein Structures in the Absence of Solvent: A Coupled Ion Mobility and Spectroscopic Study," Angewandte Chemie—International Edition 55(45): 14173-14176.

Stark et al. (Feb. 2016) "Sample preparation of biological macromolecular assemblies for the determination of high-resolution structures by cryo-electron microscopy," Microscopy 65(1):23-34.

Thompson et al. (May 2016) "An introduction to sample preparation and imaging by cryo-electron microscopy for structural biology," Methods 100: 3-15.

Westley et al. (1998) "Density and index of refraction of water ice films vapor deposited at low temperatures," J. Chemical Physics 108(8):3321-3326.

Yu et al. (2014) "Single-step antibody-based affinity cryo-electron microscopy for imaging and structural analysis of macromolecular assemblies," J. Structural biology 187(1):1-9.

Zallen (1983) The Physics of Amorphous Solids, Wiley-VCH, Germany: 8-10.

Chinese Search Report dated Sep. 28, 2021 in Chinese Application No. 201880040096, 3 pp.

Chinese First Office Action dated Oct. 11, 2021 in Chinese Application No. 201880040096.

Japanese Search Report dated Feb. 17, 2022 in Japanese Application No. 2019-565506.

\* cited by examiner a)

b)

GAS PHASE SAMPLE PREPARATION FOR CRYO-ELECTRON MICROSCOPY

CROSS-REFERENCE TO RELATED APPLICATIONS

This application is a continuation of U.S. patent application Ser. No. 17/365,698, filed Jul. 1, 2021, which is a continuation of U.S. patent application Ser. No. 16/626,250, filed Dec. 23, 2019, issued as U.S. Pat. No. 11,092,523 on Aug. 17, 2021, which is a U.S. National Stage Application filed under 35 U.S.C. § 371 of International Application No. PCT/US2018/041120, filed Jul. 6, 2018, which claims the benefit of U.S. Provisional Patent Application No. 62/529,778, filed Jul. 7, 2017. These applications are hereby incorporated by reference in their entireties.

STATEMENT REGARDING FEDERALLY SPONSORED RESEARCH OR DEVELOPMENT

This invention was made with government support under GM118110 awarded by the National Institutes of Health. The government has certain rights in the invention.

BACKGROUND OF THE INVENTION

X-ray crystallography has traditionally been the standard for providing structural analysis for biological research, and while X-ray crystallography still provides high resolution structural information, this technique has several downsides. One such limitation is that a large amount of sample is required for X-ray crystallography. This makes X-ray crystallography impractical in cases where it is difficult to generate large, highly pure quantities of the target molecule.

Single particle cryo-electron microscopy (cryo-EM) is emerging as a powerful alternative for structural studies of eukaryotic cells, proteins (>150 kDa), and macromolecular complexes (e.g., liposomes, organelles, and viruses) (Stark et al., Microscopy, 2016, 65(1):23-34)). Cryo-EM is unique, providing 3D structural information on non-crystalline specimens while also often requiring smaller sample amounts than X-ray crystallography. With the development of a new class of electron detector and advances in software image reconstruction, cryo-EM has approached atomic level resolution, enabling many new biological discoveries. This technology has driven considerable interest, but it still has a number of limitations, including resolution that is still a factor of four less than what is theoretically possible (Glaeser, R. M., Nature Methods, 2016, 13(1):28-32). The majority of limitations are due to sample preparation, which typically requires purification and vitrification. Encasing the sample in vitreous ice (i.e., amorphous ice) helps protect the sample from radiation damage from the electron microscope. Ideal sample vitrification would involve use of an amorphous ice layer, just thick enough to accommodate the particle(s) of interest.

However, in practice, the process of sample vitrification is far from ideal. Typical sample preparation techniques involve solubilization of protein analytes in water followed by pipetting onto a hydrophilic EM grid. The grid is blotted with filter paper (removing >99.99% of the sample) and then plunged into a bath of cryogen, vitrifying the remaining water/sample. A key component to obtaining proper 3D data from EM structures is that the particles must all be of the same structural conformation but randomly oriented within the amorphous ice. Proper 3D analysis is completed via reconstruction of a number of images, thus requiring numerous particles randomly oriented in the same structural conformation. Unfortunately, currently existing sample preparation techniques impart a preferred orientation of the particles (due largely to particle migration to the air/water interface), and the particles often become deformed/stretched at the air-water interface, thereby destroying the required structural heterogeneity. Similar deformations arise from the absorption of the sample to the EM grid substrate. For many cases, the imaged structural heterogeneity does not exist in nature, and without a means of separating the multiple conformations, cryo-EM often cannot be utilized to obtain 3D information (Glaeser, R. M., Nature Methods, 2016, 13(1):28-32; and Yu et al., J. Structural biology, 2014, 187:1-9).

Another requirement of an ideally vitrified specimen is to have a high density of randomly oriented identical molecules located within a hole of the cryo-EM grid. This imposes a significant problem as conventional preparation techniques yield only a very few particles per grid hole. Several factors contribute to this issue. First is that the majority of the sample gets removed during the blotting process. Highly concentrated samples can help compensate for this problem. However, even at the highest concentrations very few particles are observed per grid hole, as they preferentially absorb to the EM-grid, leaving the holes less occupied. Second, formation of ice in conventional methods causes the ice at the center of a hole in the grid to be thinner than the ice near the edges, forcing the particles to the outer edges. This process can also impart a preferred orientation, especially if the molecules are thicker in one dimension than another. With only a few analyte particles per hole, data acquisition times must be extended and data files become very large (i.e., greater than 5 Tb), since much of the EM grid must be imaged to generate sufficient signal for analysis. Beyond limiting the scope and types of proteins that can be analyzed, conventional approaches puts a significant strain on the computational resources required to analyze the data Cheng et al., Cell, 2015, 161(3):438-449).

For these reasons, it is desirable to obtain improved cryo-EM sample preparation methods and systems so as to improve the applicability and accuracy of cryo-EM.

SUMMARY OF THE INVENTION

The present invention provides new methods for controllably forming a layer of amorphous ice and other frozen amorphous solids on a substrate, and also provides cryo-EM sample preparation methods and systems that utilize in vacuo vitrification. In certain aspects of the invention, formation of an amorphous solid layer is independent of the deposition of a sample to be analyzed, thus allowing for the generation of uniformly thick layer. Furthermore, the formation of an amorphous solid layer may be monitored during formation and any imperfection in the solid layer may be corrected using ion milling or related techniques. In certain aspects, the present invention is also able to provide cryo-EM sample preparation resulting in increased image resolution, decreased image acquisition time, and increased sensitivity.

Certain aspects of the invention further include the use of mass spectrometry to purify analyte particles, including but not limited to proteins, protein complexes, and cells, in the gas-phase for subsequent vitrification. Samples prepared in this way can be extracted from the mass spectrometer using a cryo-transfer sample holder and placed directly into an EM for imaging. One implementation of this method utilizes a modified mass spectrometer that allows for gas-phase purification of analyte ions. The ions will be passed over a cooled sample probe where they are deposited onto an EM sample holder and vitrified.

Amorphous solids, or non-crystalline solids, refer to solids that lack the long-range molecular order characteristic of crystals. For example, ice formed using the methods and systems described herein is preferably vitreous ice (also referred to herein as amorphous ice). Common $H_2O$ ice is a hexagonal crystalline material where the molecules are regularly arranged in a hexagonal lattice. In contrast, vitreous ice lacks the regularly ordered molecular arrangement. Vitreous ice and the other amorphous solids available with the present invention are produced either by rapid cooling of the liquid phase (so the molecules do not have enough time to form a crystal lattice) or by compressing ordinary ice (or ordinary solid forms) at very low temperatures.

One embodiment of the present invention provides a method for preparing a sample for cryo-electron microscopy (cryo-EM) comprising the steps of forming a vapor stream of atoms or molecules, and directing the vapor stream toward a substrate surface such that the atoms or molecules impinge on the substrate surface while under vacuum. The substrate surface is at a temperature of −100° C. or less (optionally at a temperature of −150° C. or less, −175° C. or less, or −195° C. or less). As a result, a layer of an amorphous solid is formed on the surface of the substrate. The method further comprises forming an analyte beam containing charged or uncharged analyte particles to be analyzed using EM; and contacting the amorphous solid layer with the analyte beam. The analyte particles are embedded on or within the deposited amorphous solid layer thereby forming a suitable sample for EM analysis.

As used in embodiments described herein, "under a vacuum" refers to a pressure of $10^{-4}$ Torr or less, a pressure $10^{-5}$ Torr or less, or a pressure $10^{-6}$ Torr or less. In embodiments, the atoms or molecules of the vapor stream contact the substrate surface, and the step of contacting the amorphous solid layer with the analyte beam, are carried out at a pressure equal to or less than $10^{-4}$ Torr, $10^{-5}$ Torr, or $10^{-6}$ Torr.

The analyte particles forming the analyte beam can be charged or uncharged particles depending on the deposition method used to deposit the molecules onto the ice layer. Preferably, the analyte particles and the molecules making the amorphous solid layer are substantially randomly orientated when deposited on the substrate, such as on a membrane, film, or EM grid. The analyte beam can be an ion beam, molecular beam, or particle beam. In an embodiment, the analyte particles are ions formed using techniques including, but not limited to, electrospray ionization and laser desorption, such as matrix-assisted laser desorption/ionization (MALDI). Preferably, the analyte particles are ionized under native electrospray conditions so as not to perturb structural conformation of the particles. In a further embodiment, the analyte ions are formed using a mass spectrometer which optionally isolates or purifies the analyte ions. Alternatively, the particle beam is a molecular beam. In a further embodiment, the molecular beam is produced by creating an aerosol of an analyte particle containing solution and introducing the aerosol into the vacuum system.

In certain embodiments, the analyte beam is characterized by an intensity selected from the range of 0.025 to 25 particles per 1 $\mu m^2$ per second, 0.05 to 10 particles per 1 $\mu m^2$ per second, or 0.1 to 5 particles per 1 $\mu m^2$ per second. In certain embodiments, the analyte beam is characterized by a spot size selected from the range of 800 $\mu m^2$ to 3.8E7 $\mu m^2$.

The analyte particles can be purified or isolated, such as by a mass spectrometer device, before being deposited onto the amorphous solid. Preferably, the analyte beam is characterized by a purity of at least 85%, 90%, 95%, or 99%. For analyte particles, such as proteins, which may have significant conformational structures, it is desirable that the analyte beam is characterized by a conformation purity of at least 85%, 90%, 95% or 99%. For example, it may be desirable to analyze the structure of a particular protein as expressed in a cell. Accordingly, it is necessary to provide an EM sample where all or most of the protein analyte molecules retain the same conformational structure.

Analyte particles useful with the present invention include, but are not limited to, protein molecules, multi-protein complexes, protein/nucleic acid complexes, nucleic acid molecules, virus particles, micro-organisms, sub-cellular components (e.g., mitochondria, nucleus, Golgi, etc.), and whole cells. In some embodiments, the analyte particles are molecular entities, single molecules, or multiple molecules complexed together through non-covalent interactions (such as hydrogen bonds or ionic bonds). In embodiments, the analyte particles have a molecular mass exceeding 1,000 Daltons, 10,000 Daltons, 50,000 Daltons, 100,000 Daltons, or 150,000 Daltons.

The deposited analyte particles may be embedded within the amorphous solid layer, deposited on the surface, or both. Since it is preferable for EM to have the analyte particles fully encased within the amorphous solid, a further embodiment comprises additionally contacting the amorphous solid layer with the atoms or molecules from the vapor stream after the analyte particles have been deposited on the amorphous solid layer. This will provide an additional layer of the solid on top of the deposited molecules. Alternatively, a further method comprises contacting the amorphous solid layer with the analyte beam concurrently with contacting the substrate surface with the atoms or molecules from the vapor stream. In a further embodiment, the vapor stream (or molecular water beam) is reflected off of one or more reflecting surfaces prior to contacting the substrate surfaced. This ensures that the atoms or molecules are broken up and have a randomized orientation before contacting the substrate.

In an embodiment, the vapor stream is generated using a Knudsen-type effusion cell, a molecular beam doser, or a co-effusion of a matrix with analyte into the system. Optionally, the vapor stream is characterized by an intensity selected from the range of 4.8E9 to 2.8E11 molecules per $\mu m^2$ per second and/or a spot size selected from the range of 800 $\mu m^2$ to 3.8E7 $\mu m^2$. In an embodiment, the vapor stream comprises a flux of molecules having a uniformity within 98% over an area of 7 $mm^2$. In certain embodiments, the vapor stream is a molecular beam. Molecular beams are streams of molecules traveling in the same or similar direction and can be produced by allowing a gas at higher pressure to expand through a small orifice into a chamber at lower pressure to form the beam. Preferably, the incident trajectory of the particles of the vapor stream contacting the substrate surface is within 1 degree of normal to the substrate surface.

Preferably the vapor stream is controlled, or the deposited amorphous solid layer is milled, etched, or otherwise refined, so that the amorphous solid layer has a thickness of 2 microns or less, 150 nm or less, or 100 nm or less. Preferably, the amorphous solid layer has a uniform thickness which does not vary by more than 5% across the substrate. Preferably, the layer of the amorphous solid has an extent of crystallinity less than or equal to 1%. Preferably, the layer of the amorphous solid has a purity of at least 85%, 90%, 95%, or 99%.

The vapor stream can comprise any molecules or atoms able to form amorphous solids where exposed to extremely low temperatures and pressures. Such molecules and atoms include, but are not limited to, cyclohexanol, methanol, ethanol, isopentane, water, $O_2$, Si, $SiO_2$, S, C, Ge, Fe, Co, Bi and mixtures thereof. Optionally, the vapor stream comprises charged molecules.

In an embodiment, the vapor stream comprises water molecules. Thus, an embodiment of the present invention provides a method for preparing a sample for cryo-electron microscopy (cryo-EM) comprising the steps of forming a molecular beam of water molecules, and contacting a surface of a substrate with the molecular water beam while under vacuum. The substrate surface is at a temperature of −100° C. or less (optionally at a temperature of −150° C. or less, −175° C. or less, or −195° C. or less). As a result, a layer of amorphous ice is formed on the surface of the substrate. The method further comprises forming an analyte beam containing charged or uncharged analyte particles to be analyzed using EM; and contacting the deposited ice layer with the analyte beam. The molecular beam is controlled, or the deposited ice is milled, etched, or otherwise refined, so that the deposited ice layer with the analyte particles has a thickness of 2 microns or less, preferably 150 nm or less, or 100 nm or less. Preferably, the ice layer has a uniform thickness which does not vary by more than 5% across the substrate.

In an embodiment, the analyte particles are ions and the analyte source is able to generate a controllable ion beam containing charged analyte ions (such as electrospray ion deposition) and direct the ion beam to contact the receiving surface of the cryo-EM probe. In a further embodiment, the system further comprises a modified mass spectrometer that can provide purified ions to the analyte source. In another embodiment, the system comprises an electron microscope where the cryo-EM probe is directly transferred from the deposition portion of the instrument to the microscope portion of the instrument for analysis.

In certain embodiments, the formation of the vitreous ice layer or other amorphous solid layer is monitored (alone or in conjunction with the deposition of the analyte particles) to ensure that the proper thickness is achieved and that the layer deposited on the substrate is amorphous as opposed to crystalline. For example, a microscale is utilized to confirm that a solid (such as ice) is being uniformly deposited on the substrate, continuous film, continuous membrane, cryo-EM grid or probe. Similarly, the vacuum chamber contains a window or other means to allow optical light or infrared light to illuminate the sample. An optical or infrared light detection cell able to receive light transmitted or reflected from the deposited solid layer is then used to determine if the solid is amorphous or crystalline. Preferably, the monitoring of the formation of the amorphous solid is performed in real time.

In an embodiment, the present invention provides a cryo-electron microscopy (cryo-EM) sample preparation system comprising: a) a vacuum chamber; b) a cryo-EM probe positioned with the vacuum chamber, wherein the cryo-EM probe comprises a receiving surface; c) a beam doser able to produce a controllable molecular beam (or vapor stream) and direct the molecular beam (or vapor stream) to contact the receiving surface of the cryo-EM probe; d) a temperature control means able to provide a temperature of −100° C. or less to the receiving surface of the cryo-EM probe; and e) an analyte source in fluid communication with the vacuum chamber, wherein the analyte source is able to produce a controllable analyte beam containing charged or uncharged analyte particles and direct the analyte beam to contact the receiving surface of the cryo-EM probe. In an embodiment, the molecular beam comprises cyclohexanol, methanol, ethanol, isopentane, water, $O_2$, Si, $SiO_2$, S, C, Ge, Fe, Co, Bi, or mixtures thereof. In an embodiment, the beam doser is able to produce a controllable molecular water beam. Optionally, the vacuum chamber is able to provide a pressure of $10^{-4}$ Torr, a pressure of $10^{-5}$ Torr, or a pressure of $10^{-6}$ Torr. Optionally, the temperature control means is able to provide a temperature of −150° C. or less, −175° C. or less, or −195° C. or less. Devices and methods for providing a vacuum chamber or other kind of surface at cryogenic temperatures are well known in the art. For example, in an embodiment, the temperature control means comprises a cold finger able to provide localized temperature control of the receiving surface of the cryo-EM probe.

Optionally, the substrate described in the embodiments provided herein is an electron microscopy (EM) grid as known in the art. The EM grid may comprise a metal, including but not limited to copper, rhodium, nickel, molybdenum, titanium, stainless steel, aluminum, gold, or combinations thereof as known in the art. Additionally, the EM grid may comprise a continuous film or membrane which is positioned across the top or bottom surface of the grid, or within the holes of the grid, so as to provide a solid support for the formation of the amorphous solid. Preferably, the EM grid is covered by a thin film or membrane which includes, but is not limited to, films and membranes comprising graphene, graphene oxide, silicon oxide, silicon nitride, carbon, and combinations thereof. With a grid that does not contain a film or membrane, the molecular beam intended to form the amorphous solid may pass through at least a portion of the holes in the grid without producing a suitable layer. The film or membrane should be thin enough so as to not scatter electrons. Preferably, the film or membrane has an approximate thickness or 15 nm or less, 10 nm or less, 5 nm or less, 2 nm or less, or 1 nm or less. In an embodiment, the substrate is an EM grid comprising a graphene or graphene oxide monolayer film or membrane positioned across the surface of the grid.

An embodiment of the present invention provides a method for forming a layer of vitreous ice on a substrate comprising the steps of: a) forming a molecular beam of water molecules; b) while under vacuum (i.e., at a pressure of $10^{-4}$ Torr or less, a pressure $10^{-5}$ Torr, or less or a pressure $10^{-6}$ Torr or less), contacting the substrate with the molecular water beam, wherein the substrate is at a temperature of −100° C. or less (optionally at a temperature of −150° C. or less, −175° C. or less, or −195° C. or less), thereby forming a layer of vitreous ice on the substrate. Preferably the deposited ice layer has a thickness of 2 microns or less, 150 nm or less, or 100 nm or less.

DETAILED DESCRIPTION OF THE INVENTION

Figure 1:
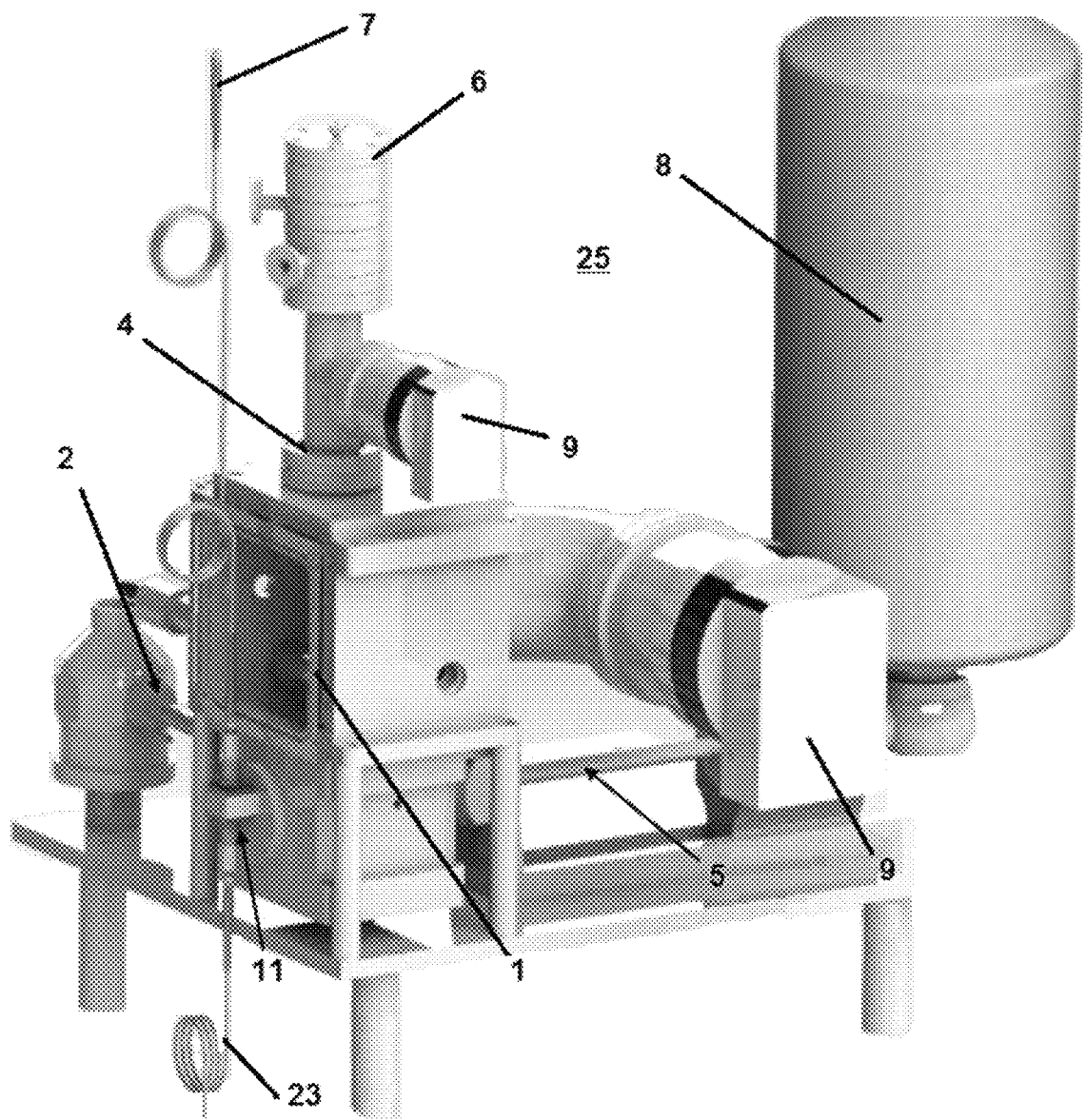
FIG. 1 shows a cryo-electron microscopy (cryo-EM) sample preparation system in an embodiment of the present invention.

In certain embodiments, the present invention provides novel cryo-EM sample preparation methods that utilize in vacuo vitrification able to: (1) increase image resolution, (2) decrease image acquisition time, and (3) allow for many orders of magnitude increase in sensitivity. Optionally, readily available mass spectrometry instruments can be used to purify proteins and protein complexes in the gas-phase for subsequent in vacuo vitrification. Samples prepared in this way can be extracted from the mass spectrometer—using a cryo-transfer sample holder and placed directly into an EM for imaging.

Example 1—Cryo-EM Sample Preparation Instruments

FIGS. 1-5 and 14-16 show exemplary cryo-electron microscopy (cryo-EM) sample preparation systems 25 according to certain embodiments of the present invention. A cryo-EM probe 2 able to hold or contain a sample is inserted into vacuum chamber 1. The temperature of the system is maintained using a coolant, such as liquid nitrogen, which is stored in tank 8 and transferred through cold finger 5, while one or more turbo pumps 9 are used to maintain the vacuum.

Figure 2:
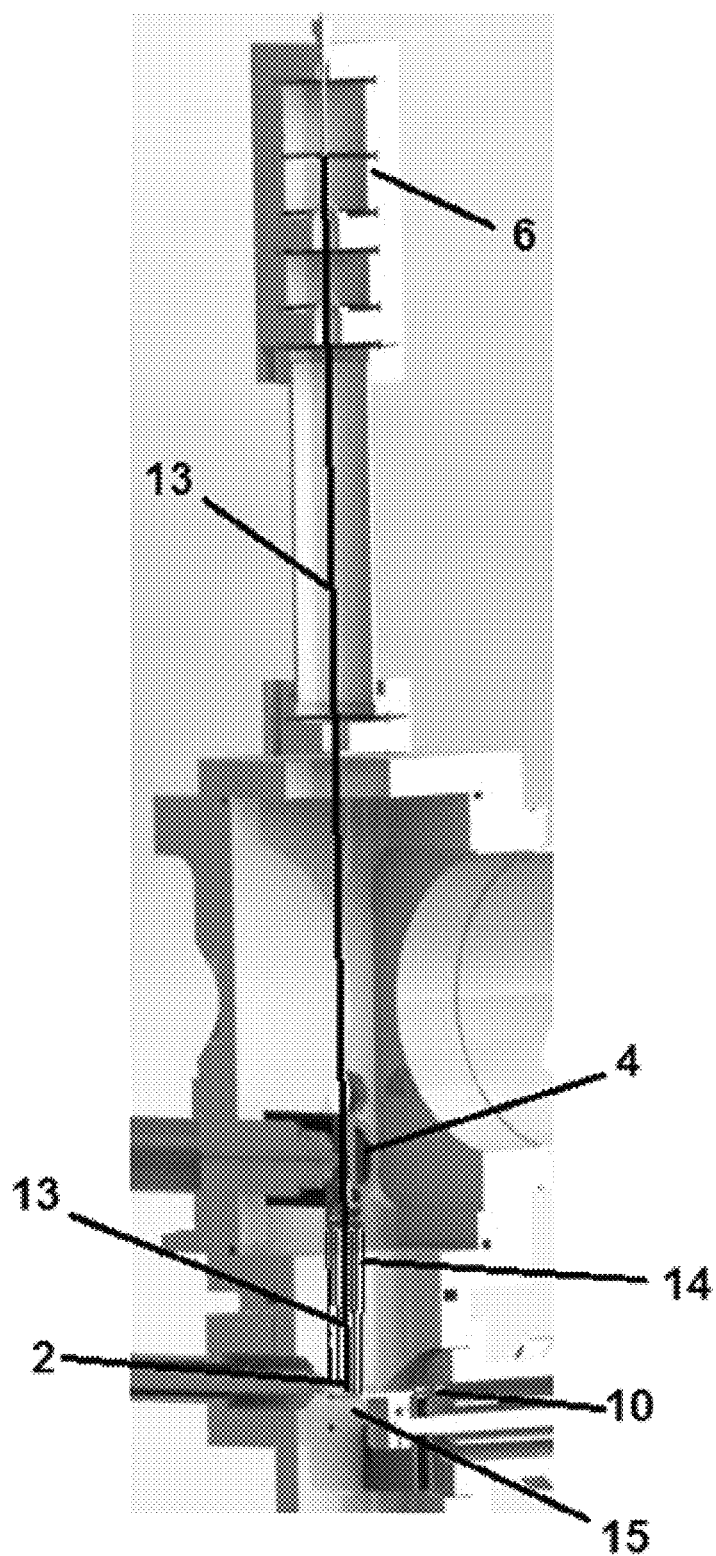
FIG. 2 shows a partial cross section of the system of FIG. 1 and further depicts the path taken the analyte beam and molecular water beam.
Figure 3:
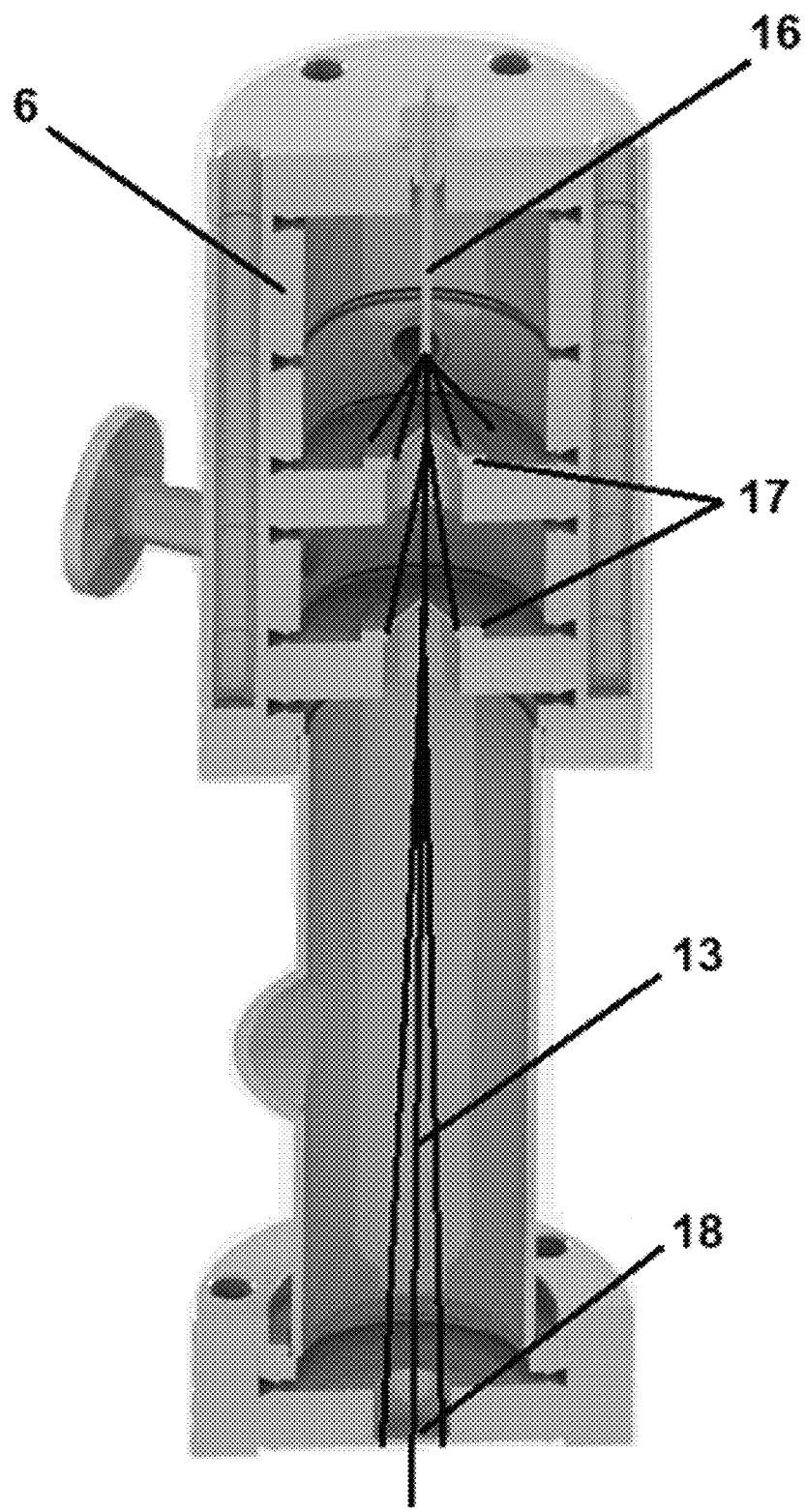
FIG. 3 shows an ion analyte source used in an embodiment of the invention, where the analyte source comprises ions optics (such as and skimmers) to focus and direct an ion beam.
Figure 4:
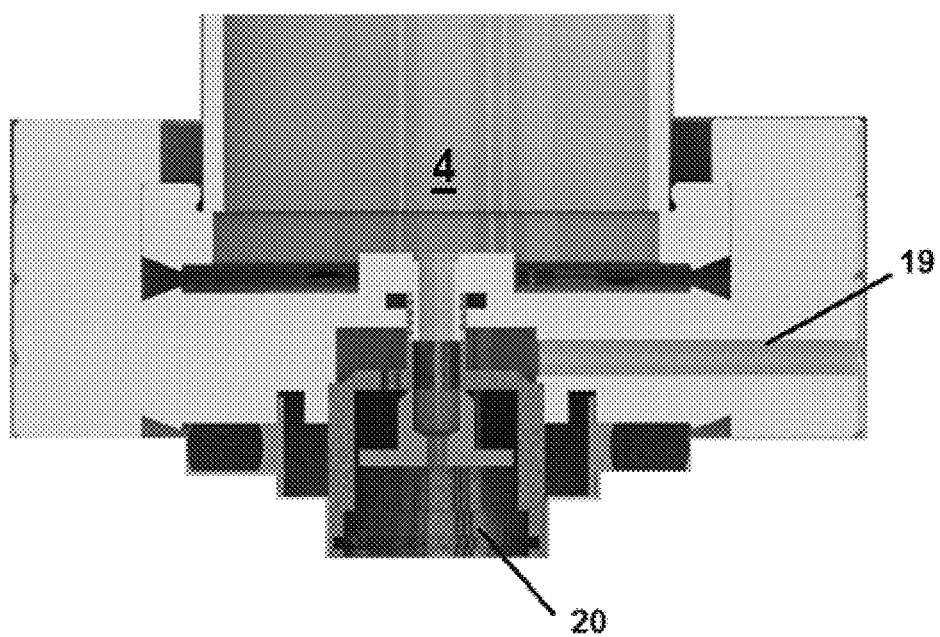
FIG. 4, panel a), shows a beam doser able to produce a controllable molecular water beam in an embodiment of the invention. Panel b) shows a cross section of a beam doser.
Figure 4:
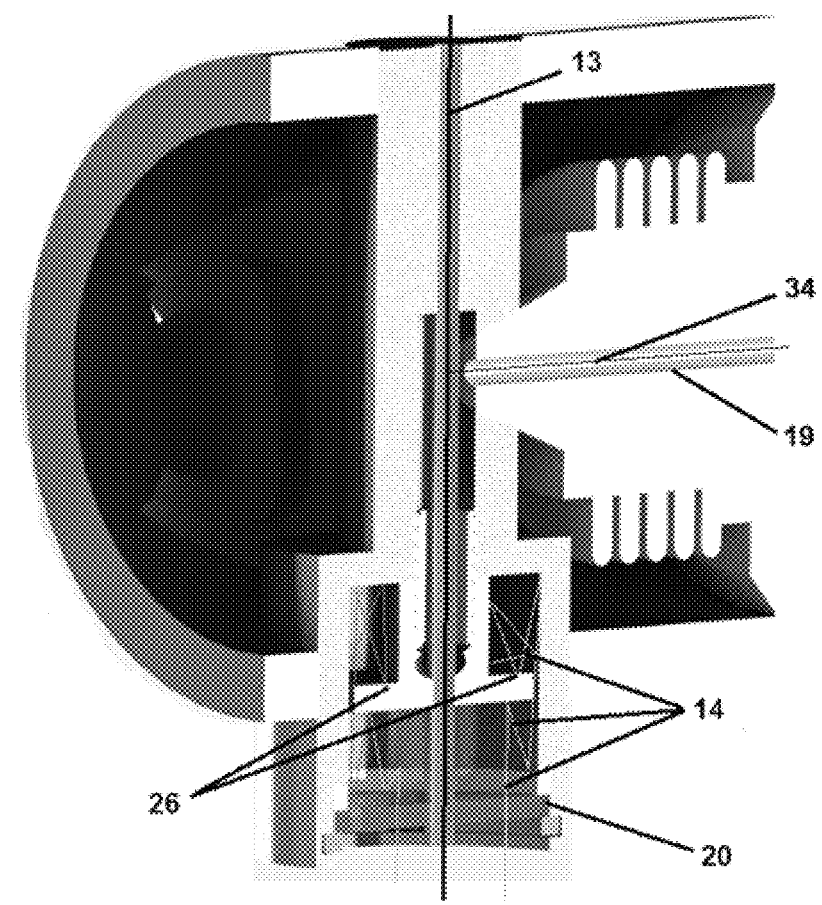
Figure 5:
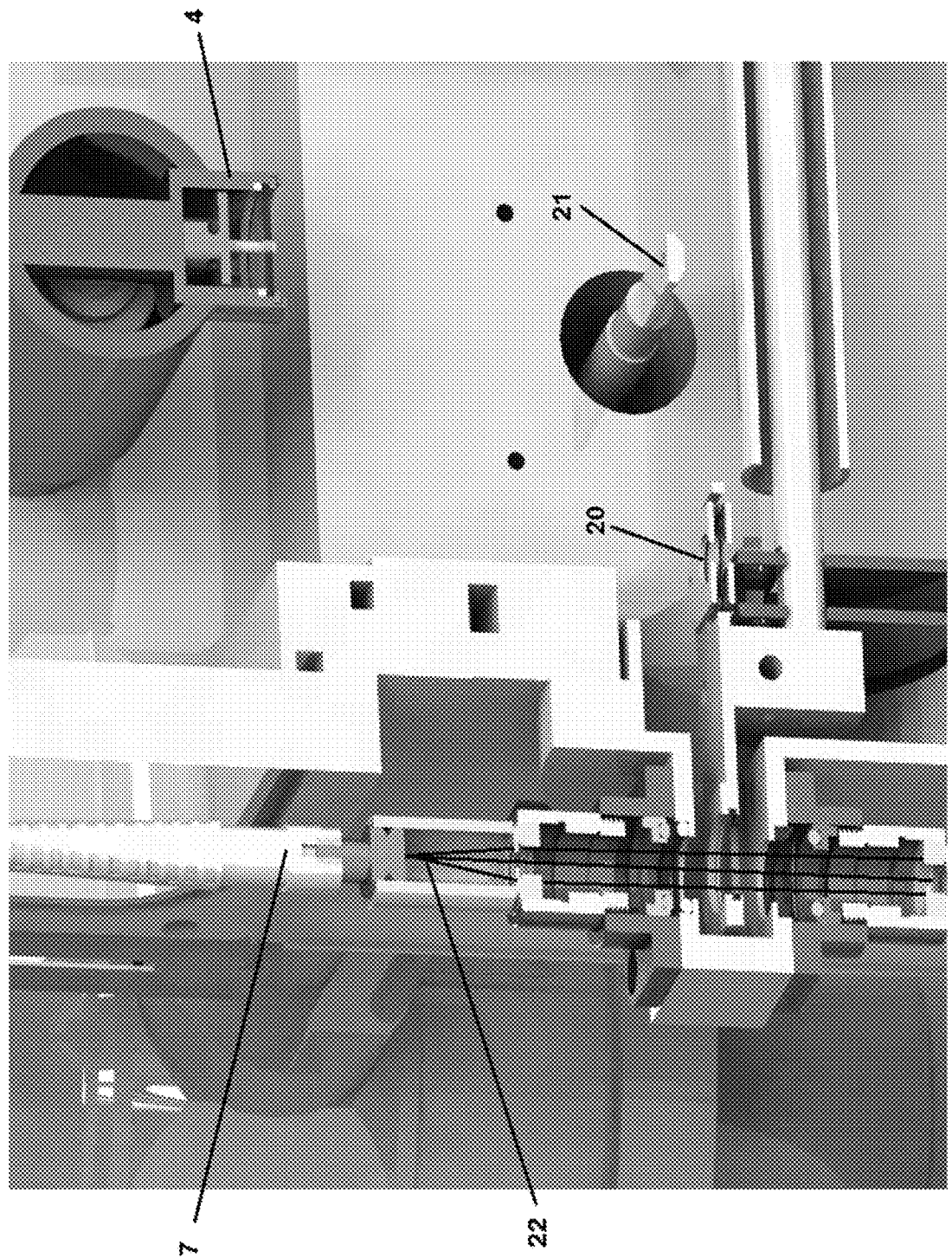
FIG. 5 shows a cross-section of an instrument including a beam doser and a sample holder, as well as an infrared light beam and microscale used to monitor the amorphous ice formed on the probe.
Figure 6:
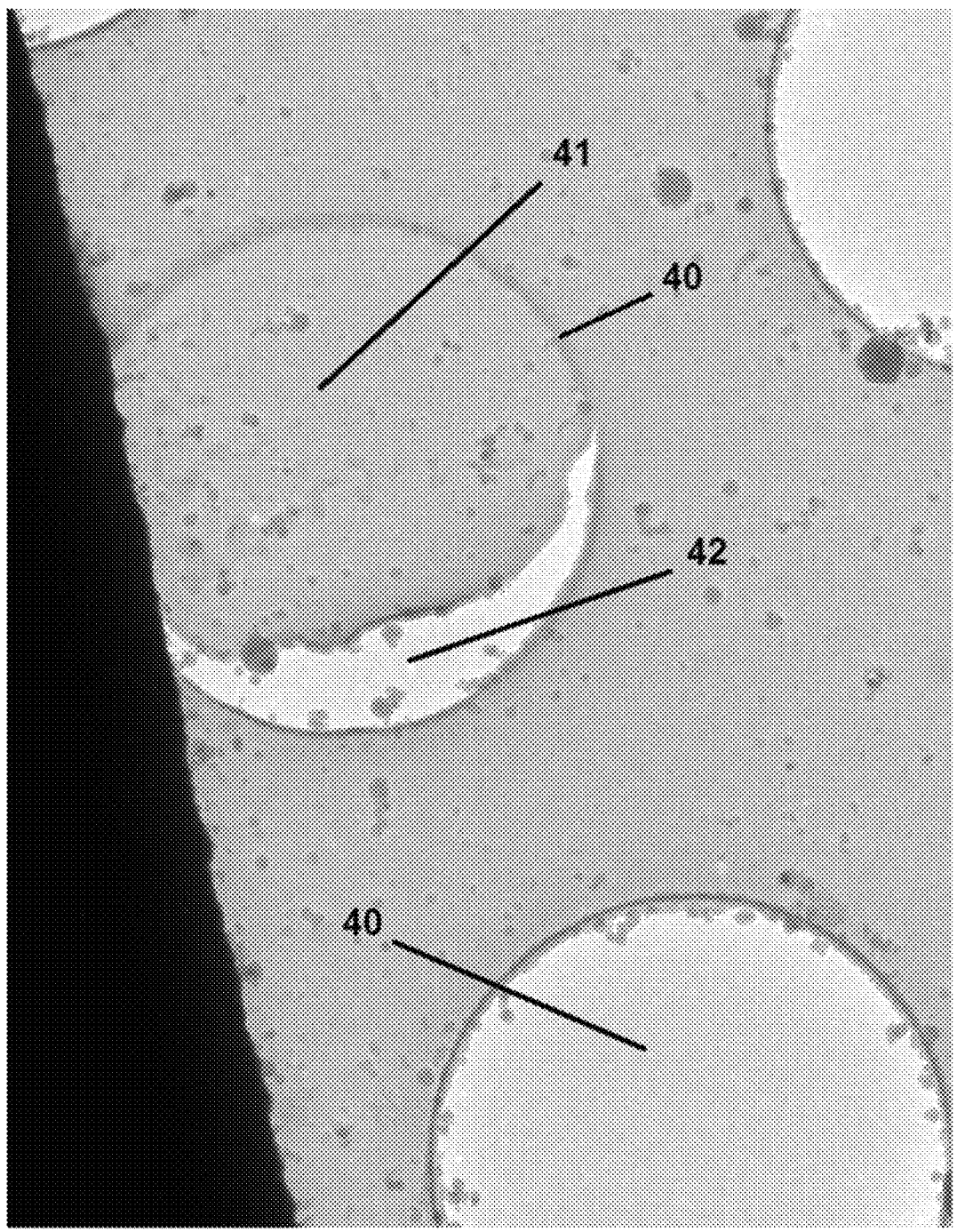
FIG. 6 shows a transmission electron microscopy (TEM) image of amorphous ice formed on a graphene oxide support film supported by a copper/gold grid. The graphene oxide support film has a thickness less than 1 nm. Holes in the support grid having amorphous ice can be clearly distinguished from holes or regions in the grid without any formation of amorphous ice.
Figure 7:
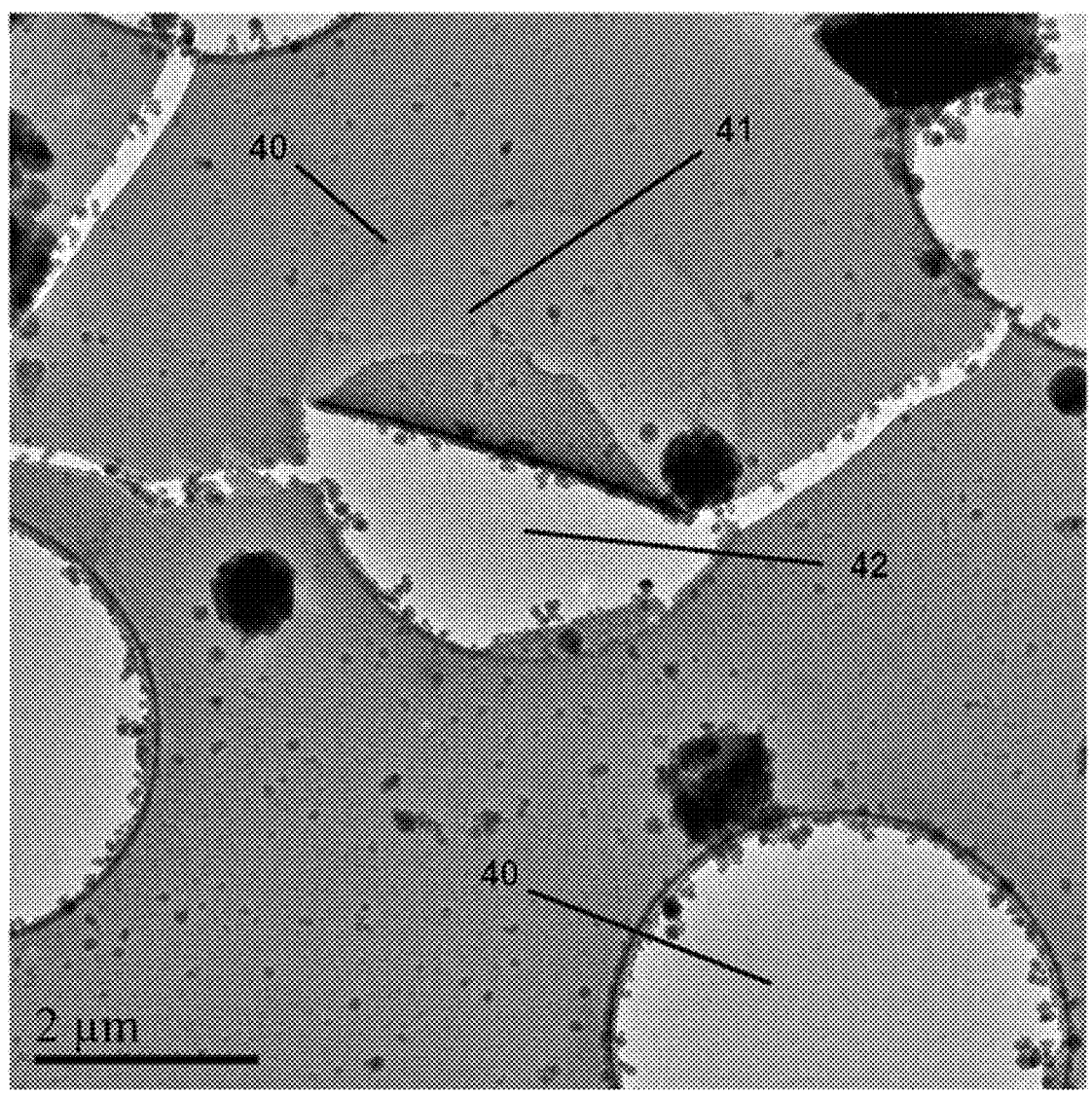
FIG. 7 shows an additional TEM image of amorphous ice formed on a graphene oxide support film, where a portion of the ice layer is folded back over itself.

Analyte particles are collected in an analyte source 6 where they are focused into an analyte beam 13 (such as through electrospray ion deposition) and directed to contact the sample plate being held by cryo-EM probe 2 (see FIG. 2). FIG. 3 shows one type of an analyte source 6 where analyte ions or molecules are drawn into the analyte source 6 through capillary 16. One or more ion optic devices, such as skimmers 17, are used to focus the analyte ions into a beam 13 and to control the release speed of the ions through exit aperture 18.

A beam doser 4 is used to generate one or more 14 molecular beams (such as molecular water beams) and direct the molecular beam down to the cryo-EM probe 2. Vapor 34 (such as water vapor) used to generate the molecular beams 14 is transported through a heated transfer line 19 and then transported along the same axis as travelled by the analyte beam 13. Optionally, the molecular beams 14 are reflected off a series of reflecting surfaces 26, which breaks up the molecules and randomizes their orientation (see FIG. 4, panel b). Microchannel plate 20 only allows reflected molecular beams 14 to pass through if the beams are orientated along the proper direction (i.e., in a direction co-axial with the analyte beam 13).

The cryo-EM probe 2 is used to laterally move the sample as needed. For example, the sample holder 21 can move the probe 2 to a quartz crystal microscale 10 which is used to monitor the build-up of the ice layer on the cryo-EM probe 2 (see FIGS. 1 and 5). Additionally, the sample can be moved to an infrared (IR) sample plate 15 which is illuminated by an IR light beam 22 provided by a fiber optic IR light source 7. The transmitted light is collected by the optical detection cell 11 and transmitted to the fiber optic IR spectrometer 23 to monitor whether the deposited ice layer comprises vitreous ice or crystalline ice.

Figure 14:
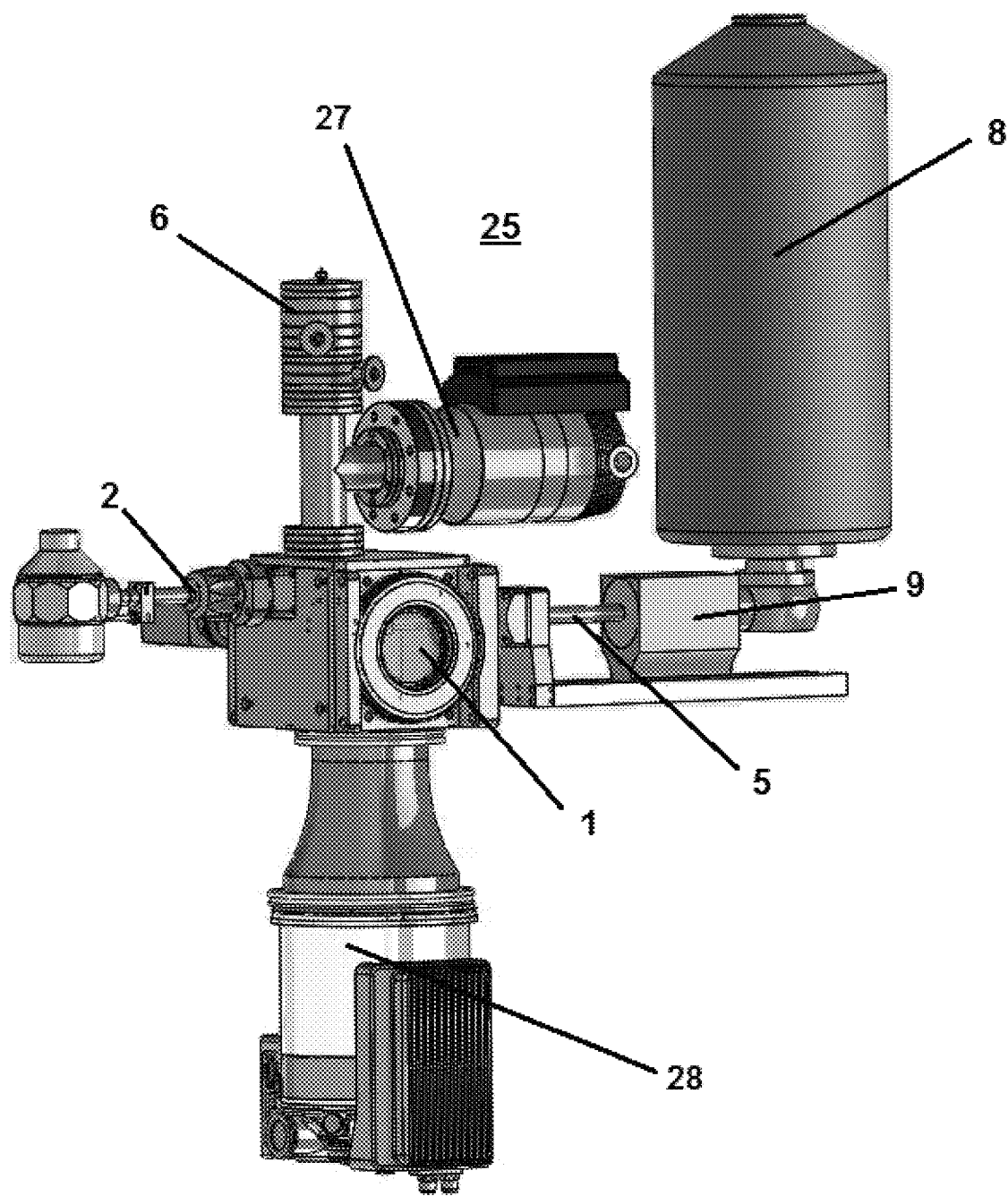
FIG. 14 shows a schematic of a cryo-electron microscopy (cryo-EM) sample preparation system similar to the embodiment shown in FIG. 1. This embodiment comprises a secondary pumping system for making the vapor stream and a storage tank able to directly store the sample after the amorphous solid has been formed on the surface of the sample.
Figure 15:
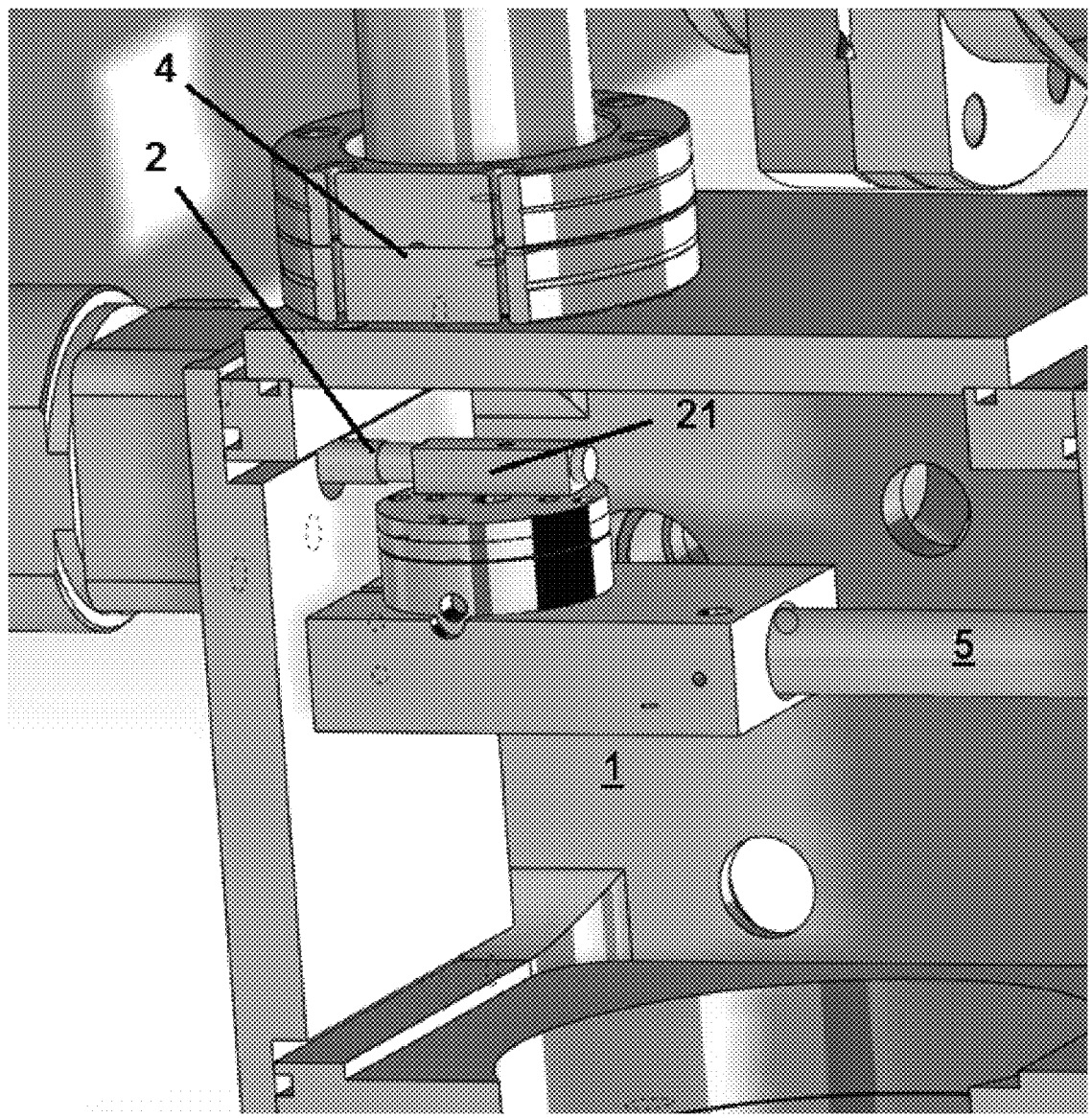
FIG. 15 illustrates a cryo probe within the vacuum chamber positioned to receive the analyte beam and molecular beam from the doser.
Figure 16:
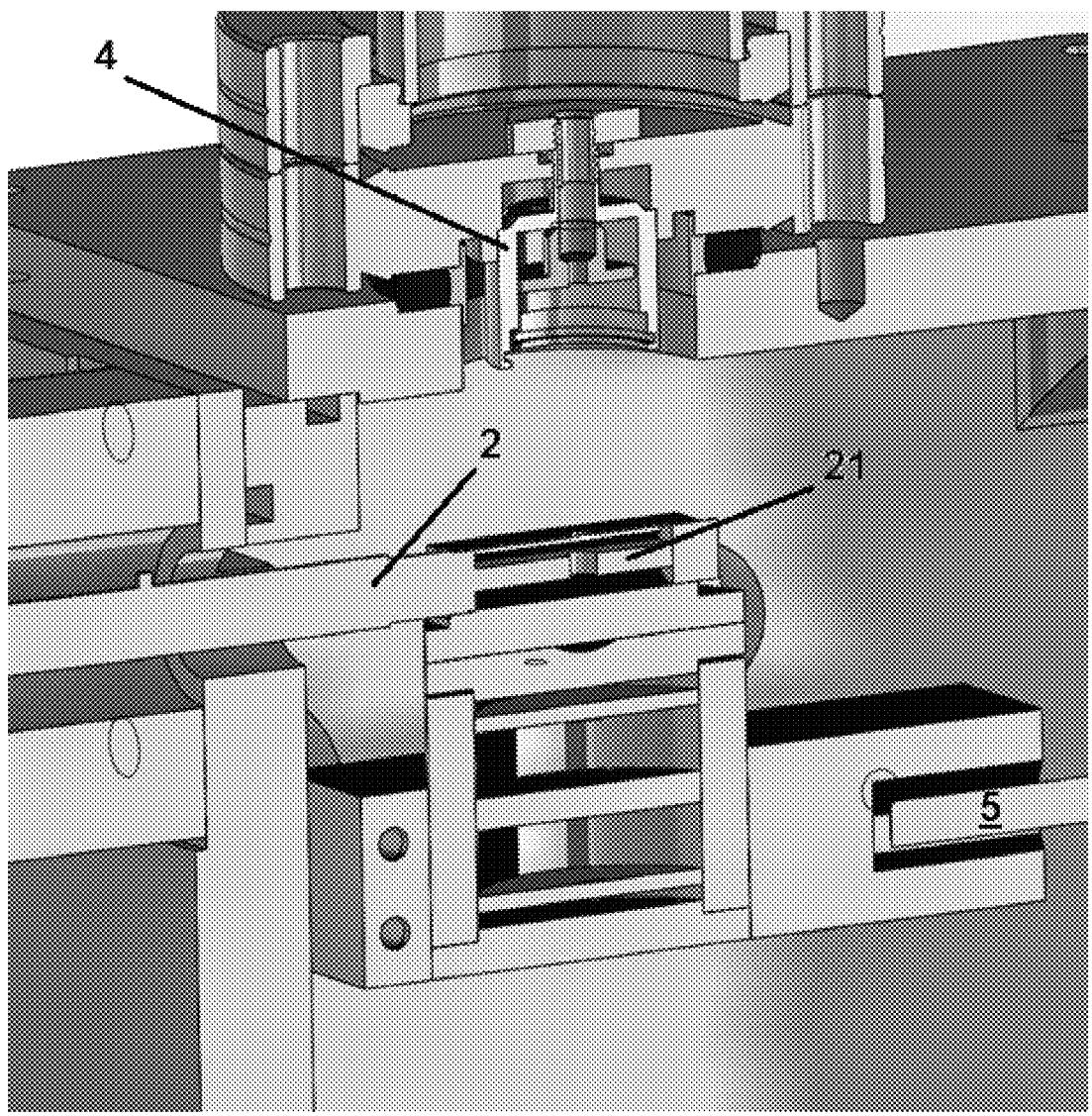
FIG. 16 illustrates a cross-section of a cryo probe within a vacuum chamber as shown in FIG. 15.

In another example, FIGS. 14-16 illustrate a cryo-electron microscopy (cryo-EM) sample preparation system 25 where the system comprises an a secondary pumping system 27 used for making the vapor stream 34, and a storage tank 28 able to directly store the sample from the vacuum chamber 1 after the vitreous ice has been formed on the sample. The storage tank is kept low temperatures and can also utilize coolants such as liquid nitrogen.

Example 2—Gas-Phase Analyte Purification

Protein ions can be purified in the gas-phase, collected in vacuo, and, once removed from the vacuum, retain their enzymatic function (Blake et al., Analytical Chemistry, 2004, 76(21):6293-6305). Following these experiments, a mass spectrometer was modified so that analyte protein ions could be purified and deposited directly onto a sample probe. The probe surface originally comprised glycerol on stainless steel; however, with the requested cryo-transfer probe, the purified protein ions are deposited directly onto a cryogenic EM grid that has previously been covered in vitreous ice. Formation of the ice layer independent of the sample allows for the generation uniformly thick ice. Any imperfection in the ice may be corrected using ion milling or related techniques. Independently forming the ice also allows for appropriate quality control measures prior to committing the sample.

Vitreous ice undergoes a phase transition from high density amorphous (HDA) ice at atmospheric pressure where it is formed, to low density amorphous (LDA) ice at the low pressures of the mass spectrometer (Mishima et al., Nature, 1998, 396(6709): 329-335). It is essential that the purified protein ions have structures that are reflective of that from solution. Ion mobility experiments have shown that under native spray conditions this is achieved (Seo et al., Angewandte Chemie-International Edition, 2016, 55(45): 14173-14176). Additionally, ion/ion chemical reactions are also used to reduce the charge of a purified protein population prior to deposition, and thereby restore solution phase structure.

Example 3—Formation of Amorphous Ice

The present invention provides methods and instruments for preparing samples of an analyte with amorphous solids for use in cryo-electron microscopy (cryo-EM). The amorphous solids, which protect the analyte from radiation damage and dehydration during imaging, must remain transparent to the electron beam during EM. This requires the amorphous solid layer (e.g., the ice layer) be thin, on the order of the same thickness of the molecules to be analyzed, and the solid must be amorphous. If the amorphous solid becomes too thick, the electrons may be scattered causing defocusing and reduction in image contrast. If ordered crystals, such as crystalline ice, begin to form, the electrons will be diffracted and the resulting diffraction pattern will obscure the image (Cheng et al., Cell, 2015, 161(3): 438-449). The difficulties associated with forming vitrified sample as described above are well known in the art.

Probably less well known is the importance that vitreous ice plays in the outer solar system and interstellar space (Fama et al., Surface Science, 2008, 602(1): 156-161; and Cleeves et al., Science, 2014, 345(6204): 1590-1593). The high vacuum and coldness of space provides a natural forming ground for vitreous ice. In fact, it is the most common form of ice outside our solar system (Guillot et al., J. Chemical Physics, 2004, 120(9):4366-4382). The obvious difficulties of studying vitreous ice have required the development of techniques to form amorphous ice in the laboratory under interstellar conditions, in particular, in cryogenic vacuum chambers. Many of the simulated conditions require the formation of very thin amorphous ice layers. This has been accomplished through the use of Knudsen-type effusion cells and molecular beam dosers placed within the vacuum system (Moeller et al., Optical Engineering, 2012, 51(11): 115601; and Huffstetler et al., Journal of Vacuum Science & Technology a-Vacuum Surfaces and Films, 2001, 19(3):1030-1031). However, these methods do not describe how to prepare amorphous solids in conjunction with a sample to be analyzed.

The formation of amorphous solids in conjunction with mass spectrometry instruments and techniques as described herein provide a novel means of preparing vitreous samples for cryo-EM which removes all the limitations associated with the currently employed plunge freezing method. In one embodiment, an uncovered cryo-EM grid or a cryo-EM grid covered by a thin continuous film or membrane held at liquid nitrogen temperatures is used as a landing surface within a mass spectrometer. Examples of EM grids with continuous films or membranes across the surface of the grid can be obtained from Quantifoil Micro Tools GmbH (Großlöbichau, Germany) and Electron Microscopy Sciences (Hatfield, Pennsylvania, USA). The grid (covered or uncovered) is populated with biomolecules utilizing gas-phase analyte purification techniques described above. Within the same vacuum chamber is a molecular beam doser aimed at the landing surface. The job of the doser is to produce a controllable molecular beam of water which impacts the cryo-surface/grid, forming vitreous ice (for general descriptions of dosers, see Guillot et al., J. Chemical Physics, 2004, 120(9):4366-4382; Moeller et al., Optical Engineering, 2012, 51(11): 115601; and Westly et al., J. Chemical Physics, 1998, 108(8):3321-3326).

Initially a very thin layer of ice is generated on the substrate. This is followed by deposition of analyte particles, either directly from an analyte source or after gas-phase purification using a mass spectrometer. Concomitantly with the collection of the analyte particles, the molecular water beam is used to encase the analyte particles in amorphous ice. Alternately, the analyte particles are landed on an initial amorphous ice surface and then covered/encased with amorphous ice using the vapor stream. Buildup of ice is monitored in real time using quartz crystal microbalances (Moeller et al., Optical Engineering, 2012, 51(11): 115601; and Gutzler et al., Review of Scientific Instruments, 2010, 81(1): 015108). When collection/sample preparation is complete, the probe and substrate are removed from the device and transferred directly into a cryo-EM.

FIGS. 6-9 show transmission electron microscopy (TEM) images of amorphous ice formed on a graphene oxide support film supported by copper and/or gold grids. The vitreous ice was collected at a temperature of −175° C., with a 15 minute exposure to the molecular beam doser under vacuum. The resulting ice layer was approximately 15 microns thick. Hexagonal ice was obtained the same manner, with the exception that the temperature was −155° C. As seen in the accompanying figures, holes 40 in the support grid covered by regions of amorphous ice 41 can be clearly distinguished from regions or holes in the grid without any formation of ice 42. Holes 47 were also drilled through the amorphous ice regions 41 crystalline ice regions 43 with an electron beam.

Figure 8:
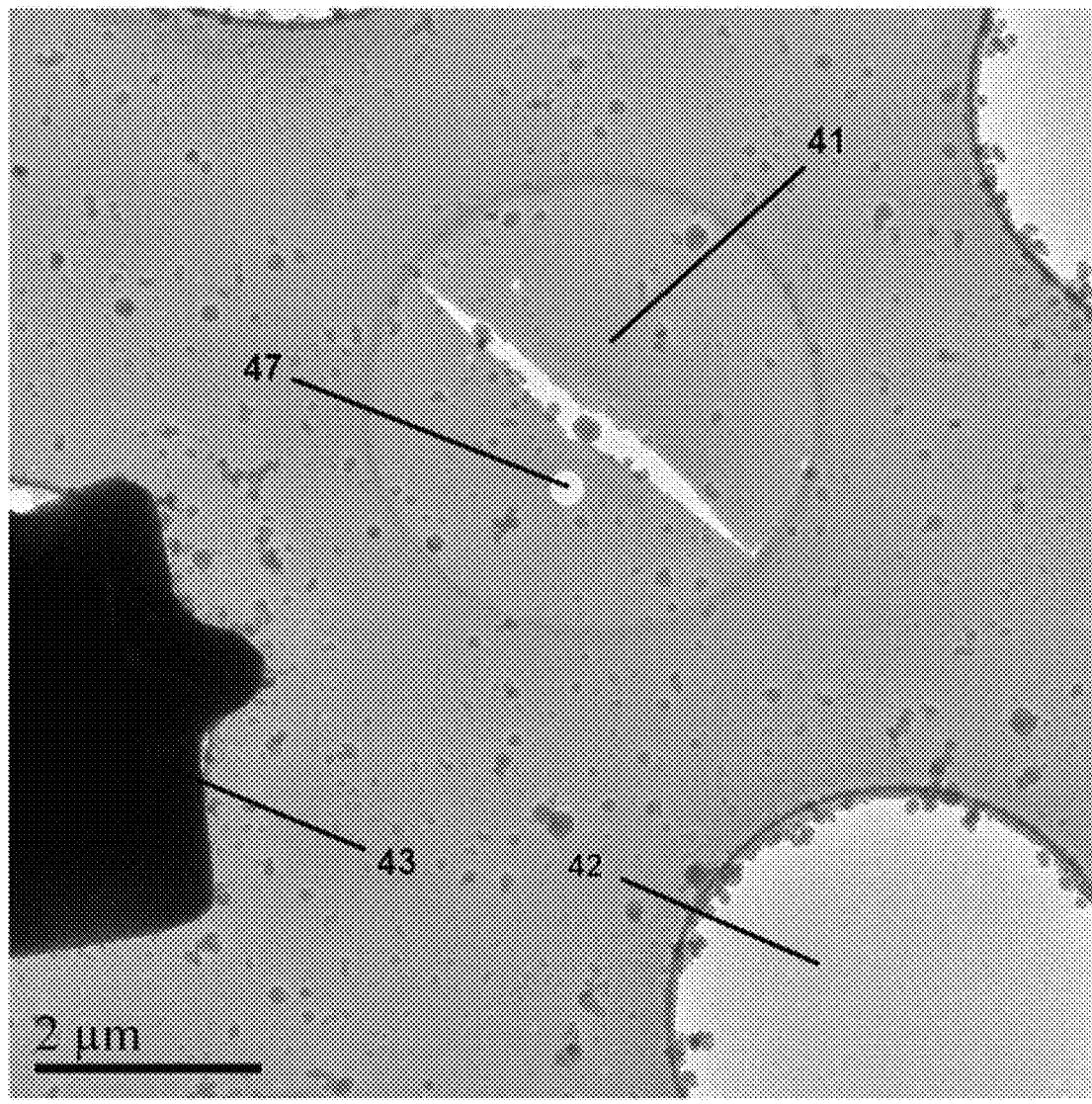
FIG. 8 shows an additional TEM image of amorphous ice formed on a graphene oxide support film. This image also shows a hole drilled through the amorphous ice with an electron beam, as well as regions having no ice and crystalline ice.
Figure 9:
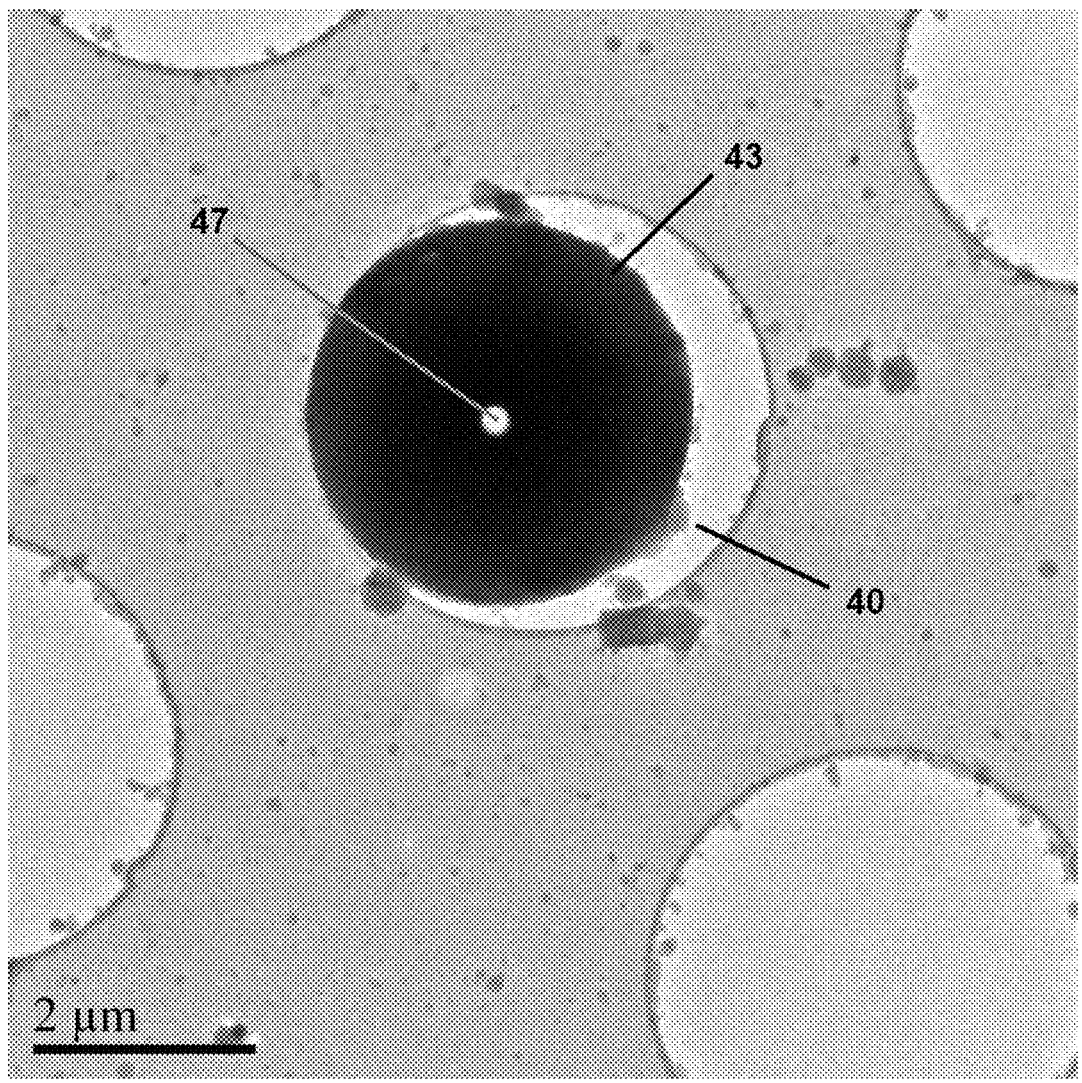
FIG. 9 shows a TEM image of crystalline ice formed on the grid with a hole drilled through the crystalline ice using an electron beam.

As seen in FIGS. 8 and 9, amorphous ice regions 41 appear very different from the regions of crystalline hexagonal ice 43. As a whole, these figures demonstrate that a layer of a solid was formed over the holes in the grid, where the layer was not the typical crystalline form of the solid.

Figure 11:
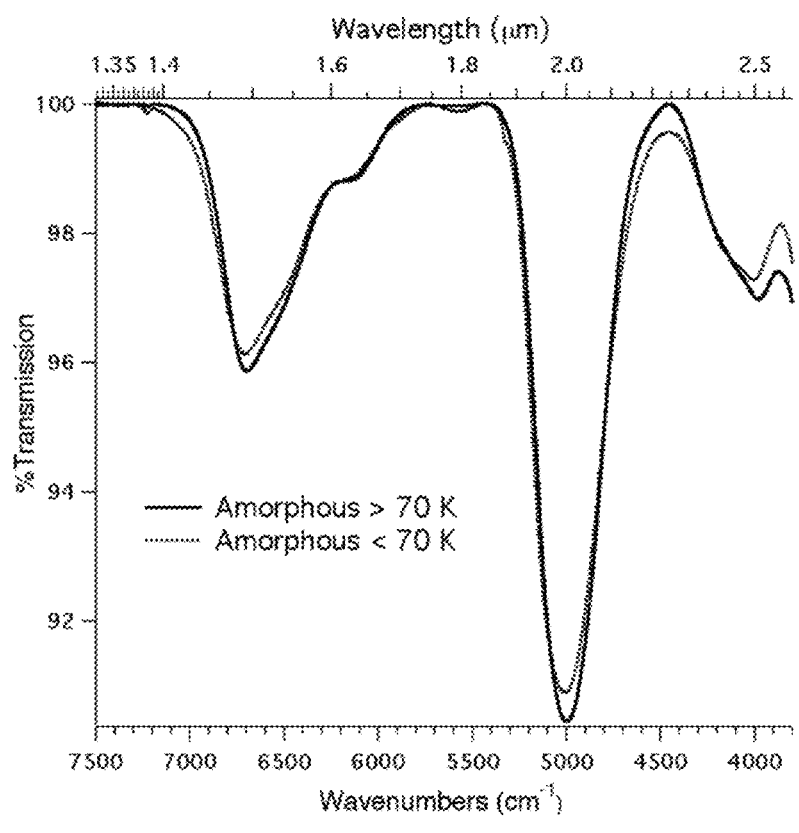
FIG. 11, top graph, shows IR spectra of amorphous $H_2O$ ice deposited at T<70 K (dashed line) and T>70 (solid line). The bottom graph shows spectra of crystalline $H_2O$ ice deposited at 20 K (solid line), 80 K (dot-dashed line), and 150 K (dotted line). These spectra were obtained from Mastrapa et al., Icarus, 2008, 197:307-320.
Figure 11:
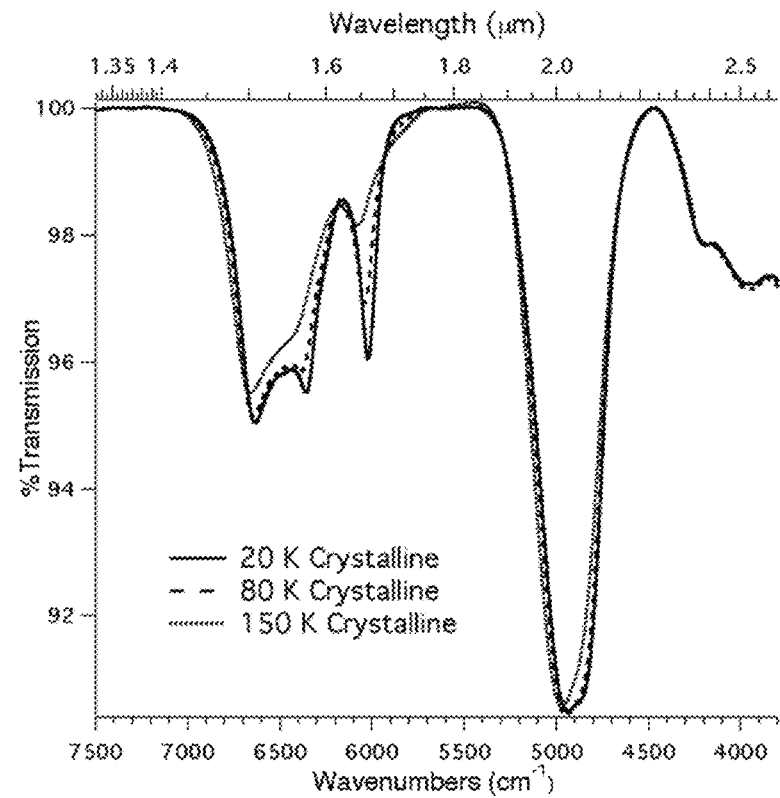
Figure 12:
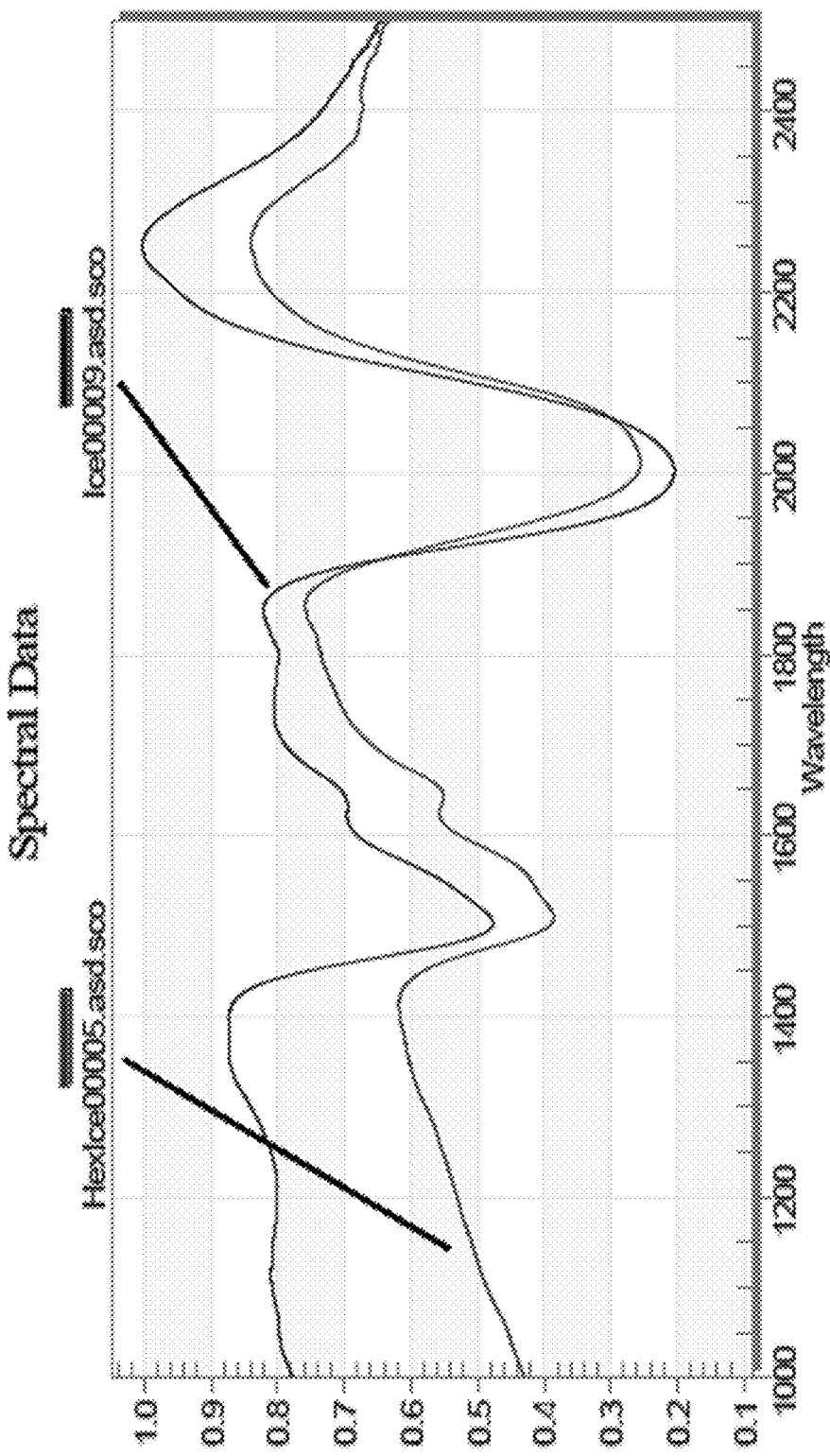
FIG. 12 shows IR spectra of crystalline hexagonal ice (bottom line) and amorphous ice (top line) obtained using the present invention.

These observations were further confirmed through infrared (IR) spectrometry. FIG. 11 shows IR spectra of amorphous $H_2O$ ice and crystalline $H_2O$ ice deposited on a substrate (Mastrapa et al., Icarus, 2008, 197:307-320). As can be seen in these spectra, the peaks from the amorphous ice shifted to shorter wavelengths compared to the peaks from the crystalline ice. FIG. 12 shows IR spectra of crystalline hexagonal ice (bottom line) and amorphous ice (top line) using the present invention. The peaks of the amorphous ice obtained under the present invention shifted to shorter wavelengths as compared to the crystalline ice, similar to what was reported in Mastrapa et al. Accordingly, it is believed these results clearly indicate that amorphous ice was successfully deposited on the sample.

Figure 10:
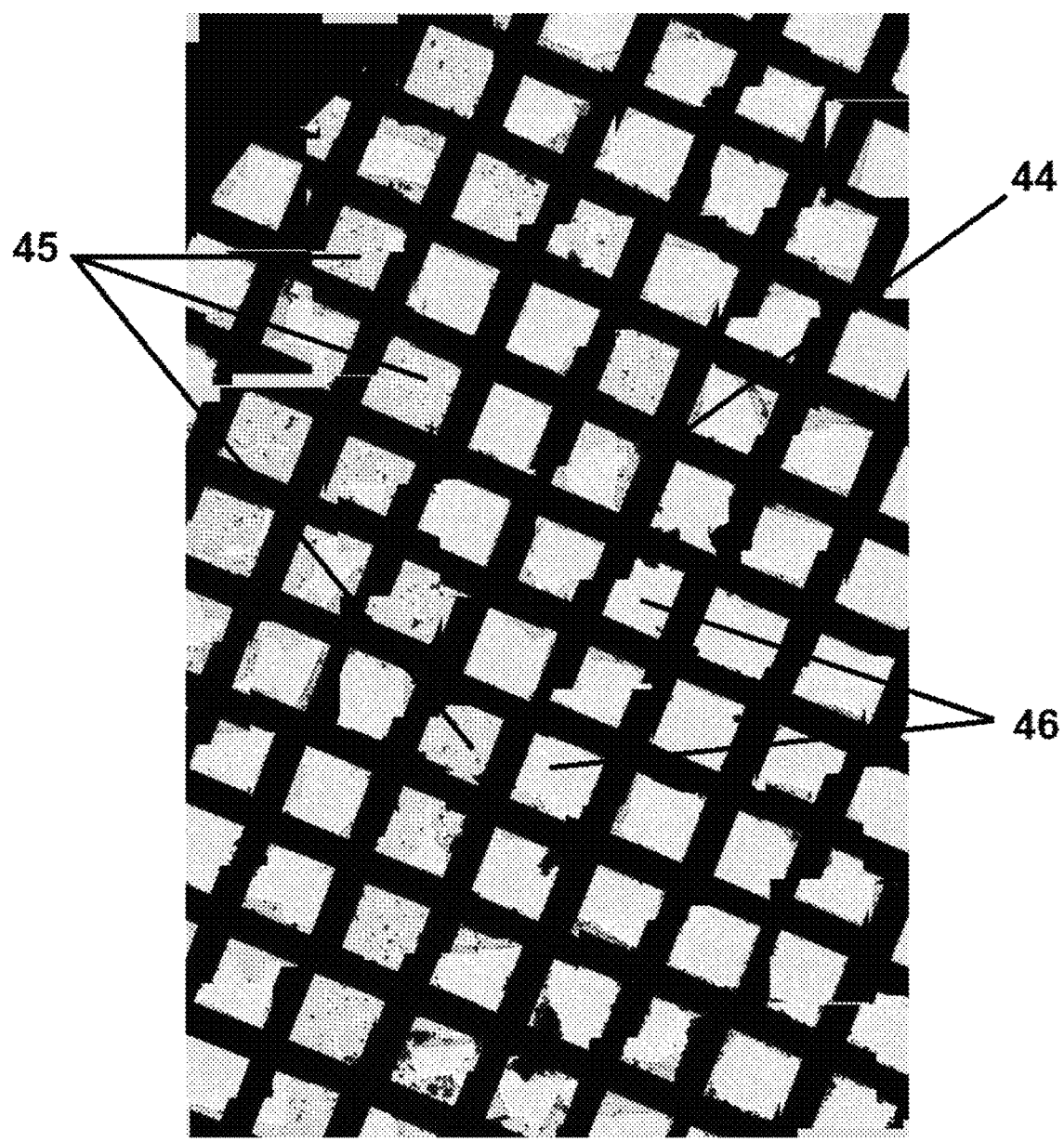
FIG. 10 shows a TEM image of amorphous ice formation on a support grid without the use of a support film covering the grid.
Figure 13:
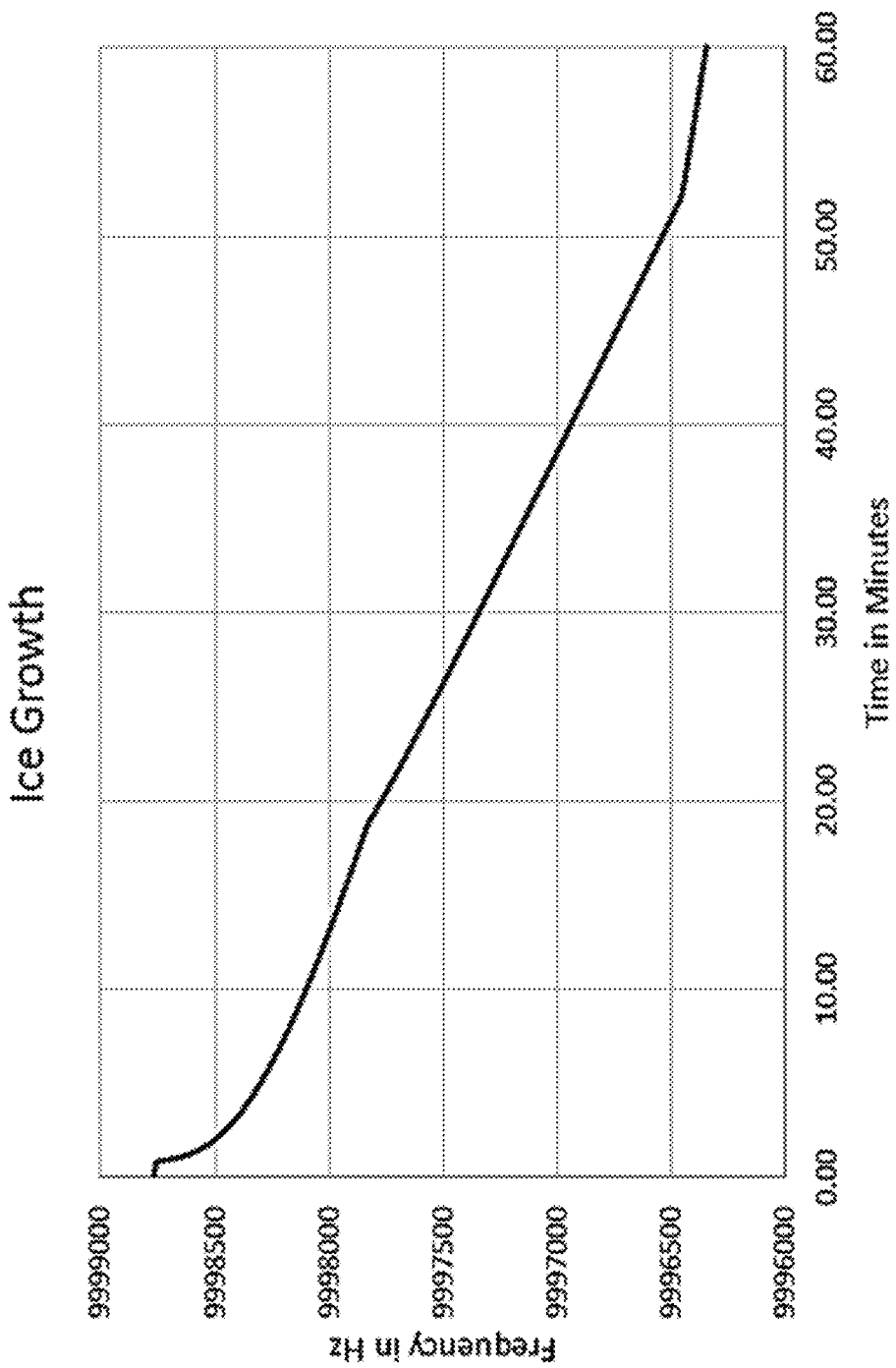
FIG. 13 illustrates the rate of growth of the amorphous ice by measuring frequency. The physical characteristics of the quartz crystal used resulted in a 21 Hz decrease in resonance frequency for every 1 nm thickness of ice which forms on its surface. From 20 minutes to 50 minutes, the rate of ice formation in this experiment was 1.94 nm/min.

Additionally, FIG. 13 illustrates the rate of growth of the amorphous ice by measuring the frequency of a quartz crystal microbalance. The physical characteristics of the quartz crystal microbalance resulted in a 21 Hz decrease in resonance frequency for every 1 nm thickness of ice which forms on its surface. Accordingly, from 20 minutes to 50 minutes, the rate of ice formation in this experiment was 1.94 nm/min While the above experiments utilized a thin continuous graphene oxide layer over a copper or gold support grid, successful formation of amorphous ice was also observed in grids which did not utilize a membrane or film over the grid. For example, FIG. 10 shows a grid 44 without the use of a continuous film or membrane. Water molecules could simply pass through at least a portion of the holes in the grid. As a result, there may be little or no ice bridging the empty holes 46. However, a layer of ice spanning several holes 45 was still seen.

Example 4—Formation of Other Amorphous Solids

The vitreous ice, which protects analytes from radiation damage and dehydration during imaging, must remain transparent to the electron beam during EM. This requires the ice layer be thin, on the order of the same thickness of the molecules to be analyzed, and the ice must be amorphous. If the amorphous ice becomes too thick, the electrons may be scattered causing defocusing and reduction in image contrast. If crystalline ice begins to form, the electrons will be diffracted and the resulting diffraction pattern will obscure the image (Cheng et al., Cell, 2015, 161(3): 438-449).

In addition to water, there are other substances which will form amorphous solids at cold temperatures. These include, but are not limited to cyclohexanol, methanol, ethanol, isopentane, $O_2$, $SiO_2$, S, C, Ge, Fe, Co, and Bi, among many others. As with water, the amorphous state is obtained through condensation from the gas phase. Unlike water, which can be transformed to an amorphous solid by several techniques, these elements require vapor-condensation to form in the non-crystalline state (Zallen R., The Physics of Amorphous Solids, 1983, 8-10). Briefly, a vapor stream of the matrix in question is formed by heating (thermal vaporization), vaporization by electron beam, vaporization by ion bombardment, or by plasma-induced decomposition, all in vacuum. The vacuum chamber contains a cold surface onto which the atoms condense. Their thermal energy is extracted before they can migrate to the crystalline conformation. The result is a thin film (<50 micron thick) of amorphous solid.

The fact that substances such as (but not limited to) Si, Ge, Fe, Co, and Bi require vapor condensation to form, the incorporation of these compounds with the instrument of Example 1 provides a novel means of preparing vitreous samples for cryo-EM with matrices other than ice. In addition to the matrix materials used, the porosity/density of the amorphous material being formed can be controlled through the deposition angle employed as well as the energy of the deposited matrix molecules (Dohnalek et al., Journal of Chemical Physics, 2003, 118(1): 364-372). This novel capability will enable fine tuning of the amorphous material to provide maximum protection to the biomolecules during cryo-EM analysis. In one instance, a cryo-EM grid (either uncovered or a grid covered by a thin film or membrane) held at liquid nitrogen temperatures is used as a landing surface within the sample preparation instrument (Example 1). The grid is populated with biomolecules utilizing electrospray deposition. Within the same vacuum chamber is a vaporization source aimed at the landing surface. This source may be placed off axes to effect the angle of incidence of the matrix molecules on the surface. The job of the vaporization source is to produce a controllable vapor stream of material (including but not limited to $H_2O$, Si, Ge, Fe, Co, Bi) that impacts the cryo-surface/grid, forming and amorphous solid.

Initially a very thin layer of material is generated on the grid. This is followed by collection of macromolecules isolated by the ESI deposition source. Concomitantly with the collection of these molecules, the vapor stream is used to encase the sample. When collection/sample preparation is complete, the probe and EM grid are removed from the sample preparation instrument and transferred directly into the cryo-EM.

Having now fully described the present invention in some detail by way of illustration and examples for purposes of clarity of understanding, it will be obvious to one of ordinary skill in the art that the same can be performed by modifying or changing the invention within a wide and equivalent range of conditions, formulations and other parameters without affecting the scope of the invention or any specific embodiment thereof, and that such modifications or changes are intended to be encompassed within the scope of the appended claims.

When a group of materials, compositions, components or compounds is disclosed herein, it is understood that all individual members of those groups and all subgroups thereof are disclosed separately. Every formulation or combination of components described or exemplified herein can be used to practice the invention, unless otherwise stated. Whenever a range is given in the specification, for example, a temperature range, a time range, or a composition range, all intermediate ranges and subranges, as well as all individual values included in the ranges given are intended to be included in the disclosure. Additionally, the end points in a given range are to be included within the range. In the disclosure and the claims, "and/or" means additionally or alternatively. Moreover, any use of a term in the singular also encompasses plural forms.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements.

One of ordinary skill in the art will appreciate that starting materials, device elements, analytical methods, mixtures and combinations of components other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. The invention illustratively described herein suitably may be practiced in the absence of any element or elements, limitation or limitations which is not specifically disclosed herein. Headings are used herein for convenience only.

All publications referred to herein are incorporated herein to the extent not inconsistent herewith. Some references provided herein are incorporated by reference to provide details of additional uses of the invention. All patents and publications mentioned in the specification are indicative of the levels of skill of those skilled in the art to which the invention pertains. References cited herein are incorporated by reference herein in their entirety to indicate the state of the art as of their filing date and it is intended that this information can be employed herein, if needed, to exclude specific embodiments that are in the prior art.

The invention claimed is:

1. A method for preparing a sample for cryo-electron microscopy (cryo-EM) comprising the steps of:
   a) forming a vapor stream of atoms or molecules;
   b) directing the vapor stream toward a substrate surface such that the atoms or molecules impinge on the substrate surface while under vacuum, wherein the substrate surface is at a temperature of $-100°$ C. or less, thereby forming an amorphous solid layer of the atoms or molecules on the substrate surface;
   c) isolating charged or uncharged analyte particles using a mass spectrometer and forming an analyte beam containing the charged or uncharged analyte particles; and
   d) contacting the amorphous solid layer with the analyte beam, thereby embedding the analyte particles on or within the deposited amorphous solid layer.

2. The method of claim 1 wherein the analyte particles are charged analyte ions and the analyte beam is an ion beam.

3. The method of claim 2 comprising generating the charged analyte ions using electrospray ionization or laser desorption.

4. The method of claim 3 wherein the charged analyte ions are ionized under native electrospray conditions.

5. The method of claim 1 wherein the analyte beam is characterized by a purity of at least 90%.

6. The method of claim 1 wherein the analyte beam is characterized by a conformation purity of at least 90%.

7. The method of claim 1 comprising additionally contacting the amorphous solid layer with atoms or molecules from the vapor stream after the analyte particles have been embedded on the amorphous solid layer.

8. The method of claim 1 comprising contacting the substrate surface with the analyte beam concurrently with contacting the substrate surface with the atoms or molecules from the vapor stream.

9. The method of claim 1 wherein the vapor stream comprises molecules or atoms able to form amorphous solids, said molecules or atoms comprising one or more of cyclohexanol, methanol, ethanol, isopentane, water, $O_2$, Si, $SiO_2$, S, C, Ge, Fe, Co, and Bi.

10. The method of claim 1 wherein the vapor stream comprises water molecules.

11. The method of claim 1 wherein the amorphous solid layer has a thickness of 2 microns or less.

12. The method of claim 1 wherein the analyte particles are protein molecules, protein complexes, or combinations thereof.

13. The method of claim 1 wherein the atoms or molecules of the vapor stream contact the substrate surface at a pressure equal to or less than $10^{-4}$ Torr.

14. The method of claim 1 wherein said step of contacting the amorphous solid layer with the analyte beam is carried out at a pressure of $10^{-4}$ Torr.

15. The method of claim 1 wherein the substrate surface is at a temperature of $-175°$ C. or less.

16. A cryo-electron microscopy (cryo-EM) sample preparation system comprising:
   a) a vacuum chamber;
   b) a cryo-EM probe positioned with the vacuum chamber, wherein said cryo-EM probe comprises a receiving surface;
   c) a beam doser able to produce a controllable molecular beam and direct said molecular beam to contact the receiving surface of the cryo-EM probe;
   d) a temperature control means able to provide a temperature of $-100°$ C. or less to the receiving surface of the cryo-EM probe; and
   e) a modified mass spectrometer in fluid communication with the vacuum chamber, wherein the mass spectrometer is able to isolate charged or uncharged analyte particles, produce a controllable analyte beam containing the isolated charged or uncharged analyte particles, and direct the analyte beam to contact the receiving surface of the cryo-EM probe.

17. The system of claim 16 wherein the analyte particles are charged analyte ions and the analyte beam is an ion beam, and wherein the mass spectrometer is able to generate the charged analyte ions using electrospray ionization or laser desorption.

18. The system of claim 16 wherein the analyte beam is characterized by a purity of at least 90% and a conformation purity of at least 90%.

19. The system of claim 16 wherein the vacuum chamber is able to provide a pressure of $10^{-4}$ Torr or less.

20. The system of claim 16 further comprising an electron microscope where the cryo-EM probe is able to be directly transferred from the vacuum chamber after being contacted with the analyte beam to the electron microscope.

* * * * *